(12) United States Patent
Chang et al.

(10) Patent No.: US 10,451,982 B2
(45) Date of Patent: Oct. 22, 2019

(54) ACTUATOR ASSEMBLY INCLUDING MAGNETIC SENSOR SYSTEM FOR VIBRATIONLESS POSITION FEEDBACK

(71) Applicant: NIKON CORPORATION, Tokyo (JP)

(72) Inventors: Patrick Chang, San Mateo, CA (US); Michel Pharand, Los Gatos, CA (US); Matthew Rosa, Tokyo (JP); Jonathan K. Wells, San Francisco, CA (US); Pedro Reynoso-Mora, Mexico City (MX)

(73) Assignee: NIKON RESEARCH CORPORATION OF AMERICA, Belmont, CA (US)

( * ) Notice: Subject to any disclaimer, the term of this patent is extended or adjusted under 35 U.S.C. 154(b) by 0 days.

(21) Appl. No.: 15/922,959

(22) Filed: Mar. 16, 2018

(65) Prior Publication Data
US 2018/0205305 A1 Jul. 19, 2018

Related U.S. Application Data

(63) Continuation-in-part of application No. 14/158,563, filed on Jan. 17, 2014, now Pat. No. 9,921,495.
(Continued)

(51) Int. Cl.
*G03B 27/58* (2006.01)
*G03F 7/20* (2006.01)
(Continued)

(52) U.S. Cl.
CPC ........ *G03F 7/7085* (2013.01); *G03F 7/70725* (2013.01); *G03F 7/70758* (2013.01);
(Continued)

(58) Field of Classification Search
CPC ...... H02K 11/20; H02K 11/21; H02K 11/215; H02K 41/033; H02K 41/031;
(Continued)

(56) References Cited

U.S. PATENT DOCUMENTS

| 4,319,236 | A | | 3/1982 | Brace et al. | |
| 5,925,956 | A | * | 7/1999 | Ohzeki | F16C 29/00 |
| | | | | | 310/12.06 |

(Continued)

*Primary Examiner* — Christina A Riddle
(74) *Attorney, Agent, or Firm* — Roeder & Broder LLP; Steven G. Roeder

(57) ABSTRACT

An actuator assembly (16) for moving a device (22) includes a stator component (30), a mover component (32), a measurement system (18), and a signal processor (20). The measurement system (18) includes (i) a magnet assembly (244) that is coupled to and moves with the mover component (32); and (ii) a plurality of spaced apart sensors (246A). The magnet assembly (244) produces a magnetic field (244B) that moves relative to the stator component (30) as the mover component (32) moves along a mover axis (32C). Each sensor (246A) is a transducer that generates a sensor signal that varies its output voltage in response to the changing magnetic field (244B) from the magnet assembly (244) as the mover component (32) is moved relative to the sensors (246A). The signal processor (20) receives the sensor signals and estimates a position of the mover component (32) along the mover axis (32C) based at least in part on the sensor signals.

20 Claims, 11 Drawing Sheets

Related U.S. Application Data

(60) Provisional application No. 62/478,462, filed on Mar. 29, 2017, provisional application No. 61/755,658, filed on Jan. 23, 2013.

(51) Int. Cl.
*H02K 11/215* (2016.01)
*H01L 21/68* (2006.01)

(52) U.S. Cl.
CPC ....... G03F 7/70775 (2013.01); H02K 11/215 (2016.01); *H01L 21/68* (2013.01); *H02K 2207/03* (2013.01)

(58) Field of Classification Search
CPC  H02K 2207/03; H02K 2201/18; H01L 21/68; G03F 7/70725; G03F 7/70691; G03F 7/70716; G03F 7/70733; G03F 7/70741; G03F 7/7075; G03F 7/70758; G03F 7/70775; G03F 7/708; G03F 7/7085; G03F 7/70816; G03F 7/707; G03F 7/70708
USPC .... 355/52, 53, 55, 72–77; 250/492.1, 492.2, 250/492.22, 493.1; 310/12.01, 12.02, 310/12.03, 12.04, 12.05, 12.06, 12.07; 318/135, 687, 685, 671, 568.16, 400.37, 318/400.38, 466, 467; 324/207.11, 324/20.713, 207.2, 207.22, 207.23, 324/207.24

See application file for complete search history.

(56) References Cited

U.S. PATENT DOCUMENTS

| | | | |
|---|---|---|---|
| 6,327,026 B1 | 12/2001 | Wakui | |
| 8,716,959 B2 | 5/2014 | David et al. | |
| 8,829,893 B2* | 9/2014 | Youngner | G01D 5/145 324/202 |
| 2002/0079888 A1 | 6/2002 | Frissen | |
| 2004/0007920 A1 | 1/2004 | Teng | |
| 2004/0226183 A1* | 11/2004 | Sielemann | G01D 3/021 33/708 |
| 2006/0001418 A1* | 1/2006 | Schroeder | G01D 5/145 324/207.21 |
| 2007/0145970 A1* | 6/2007 | Takahashi | G01D 5/145 324/207.24 |
| 2008/0094012 A1 | 4/2008 | Huang et al. | |
| 2008/0169806 A1 | 7/2008 | Huang et al. | |
| 2008/0203828 A1 | 8/2008 | Compter | |
| 2008/0285005 A1 | 11/2008 | Gery | |
| 2009/0195195 A1 | 8/2009 | Huang | |
| 2011/0208459 A1 | 8/2011 | Butler | |
| 2012/0118136 A1* | 5/2012 | Heerdt | F15B 15/2861 91/1 |
| 2012/0262157 A1 | 10/2012 | Liebart | |
| 2013/0069449 A1 | 3/2013 | Pharand | |

\* cited by examiner

ACTUATOR ASSEMBLY INCLUDING MAGNETIC SENSOR SYSTEM FOR VIBRATIONLESS POSITION FEEDBACK

RELATED APPLICATIONS

This application is a continuation-in-part of U.S. patent application Ser. No. 14/158,563, entitled "MAGNETIC SENSOR CALIBRATION AND SERVO FOR PLANAR MOTOR STAGE", and filed on Jan. 17, 2014, which is currently pending. Additionally, U.S. patent application Ser. No. 14/158,563 claims priority on U.S. Provisional Ser. No. 61/755,658, filed Jan. 23, 2013, and entitled "HALL SENSOR CALIBRATION AND SERVO FOR PLANAR MOTOR STAGE". As far as permitted, the contents of U.S. patent application Ser. No. 14/158,563, and U.S. Provisional Application Ser. No. 61/755,658, are incorporated in their entirety herein by reference.

Additionally, this application also claims priority on U.S. Provisional Application Ser. No. 62/478,462 filed on Mar. 29, 2017, and entitled "MAGNETIC SENSOR SYSTEM FOR VIBRATIONLESS POSITION FEEDBACK". As far as permitted, the contents of U.S. Provisional Application Ser. No. 62/478,462, are incorporated in their entirety herein by reference.

BACKGROUND

Actuators are commonly used to move and position a device during a manufacturing or testing operation. In some applications, the actuator is used to move and position the device in one degree of freedom, e.g., along a single axis. However, in other applications, the actuator can be used to move and position the device in multiple degrees of freedom, e.g., up to six degrees of freedom. Commonly, a measurement system is used to monitor the position of the actuator and/or the device for closed loop control of the actuator. There is a continuing desire to improve the accuracy in which the actuator moves and positions the device and/or to decrease the cost of the measurement system.

SUMMARY

The present invention is directed toward an actuator assembly for moving and positioning a device along a first axis. In various embodiments, the actuator assembly includes a stator component, a mover component, a measurement system and a signal processor. The mover component moves relative to the stator component along a mover axis. Additionally, the mover component is coupled to the device so that the device moves relative to the stator component as the mover component is moved relative to the stator component along the mover axis. The measurement system includes (i) a magnet assembly that is coupled to and moves with the mover component, the magnet assembly producing a magnetic field that moves relative to the stator component as the mover component moves relative to the stator component; and (ii) a plurality of spaced apart sensors that are fixed in position relative to the stator component, the sensors being positioned along a path of the mover component such that at least one of the sensors is positioned within the magnetic field at all times as the mover component moves relative to the stator component along the mover axis. In such embodiments, the sensors are configured to sense changes in the magnetic field produced by the magnet assembly as the mover component moves along the mover axis. Additionally, each sensor is a transducer that generates a sensor signal that varies its output voltage in response to the changing magnetic field from the magnet assembly as the mover component is moved relative to the sensors. The signal processor receives the sensor signals and estimates a position of the mover component along the mover axis based at least in part on the sensor signals.

In some embodiments, the plurality of sensors are aligned and spaced apart along a sensor axis. Further, the sensor axis can be substantially parallel to the mover axis.

Additionally, in certain embodiments, the mover component only moves along the mover axis relative to the stator component. In one such embodiment, the stator component includes a tubular-shaped stator body, and the mover component includes a piston disc that is positioned within the stator body and is configured to move along the mover axis relative to the stator body. Further, in such embodiment, the mover component and the stator component cooperate to form a first chamber within the stator body on one side of the piston disc, and a second chamber within the stator body on the opposite side of the piston disc. Still further, in such embodiments, the actuator assembly can further include an actuator including a fluid source that is in fluid communication with the first chamber via a first transfer port and that is in fluid communication with the second chamber via a second transfer port. Moreover, in such embodiment, the actuator selectively directs fluid from the fluid source into and out of the first chamber and the second chamber via the first transfer port and the second transfer port, respectively, to selectively control a pressure in each of the first chamber and the second chamber.

In some embodiments, the actuator assembly further includes an actuator that moves the mover component relative to the stator component along the mover axis. In such embodiments, the signal processor can be electrically connected to the actuator to position the mover component and the device relative to the stator component based at least in part on the sensor signals.

A number of different methods can be used by the signal processor to process the sensor signals from the sensors. Additionally, the actuator assembly can further include a calibration measurement system that generates a mapping signal as the mover component is moved along the mover axis, with the signal processor being configured to map a position of each of the plurality of sensors based at least in part on the sensor signals and the mapping signal. For example, the signal processor can use a look-up table and the sensor signals to estimate the position of the mover component. Alternatively, the signal processor can use a curve-fitting method to estimate the position of the mover component from the sensor signals. In one such embodiment, the signal processor can use a triangle curve-fitting method to estimate the position of the mover component from the sensor signals.

In certain embodiments, the magnet assembly includes a permanent magnet that is surrounded by the magnetic field. Additionally, the magnet assembly can have a magnet axis that is substantially parallel to the mover axis. In one such embodiment, the permanent magnet has a perpendicular orientation relative to the magnet axis. Alternatively, in another such embodiment, the permanent magnet has an axial orientation relative to the magnet axis.

Additionally, the present invention is also directed toward a method for moving a device, comprising the steps of (A) providing a stator component; (B) coupling a mover component to the device; (C) moving a mover component relative to the stator component along a mover axis so that the device moves relative to the stator component as the mover component is moved relative to the stator component along the mover axis; (D) coupling a magnet assembly to the mover component, the magnet assembly producing a magnetic field that moves relative to the stator component as the mover component moves relative to the stator component; (E) positioning a plurality of spaced apart sensors in a fixed position relative to the stator component, the sensors being positioned along a path of the mover component such that at least one of the sensors is positioned within the magnetic field at all times as the mover component moves relative to the stator component along the mover axis, the sensors being configured to sense changes in the magnetic field produced by the magnet assembly as the mover component moves along the mover axis, each sensor being a transducer that generates a sensor signal that varies its output voltage in response to the changing magnetic field from the magnet assembly as the mover component is moved relative to the sensors; (F) receiving the sensor signals with a signal processor; and (G) estimating a position of the mover component along the mover axis with the signal processor based at least in part on the sensor signals.

Further, the present invention is also directed toward a stage assembly that includes a base, a stage, and the actuator assembly as described above.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Embodiments of the present invention are described herein in the context of an actuator assembly for positioning a device in one or more degrees of freedom, e.g., along a first axis. More specifically, in various embodiments, the actuator assembly includes a measurement system that incorporates and/or utilizes a magnetic sensor system for vibrationless position feedback.

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-related and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
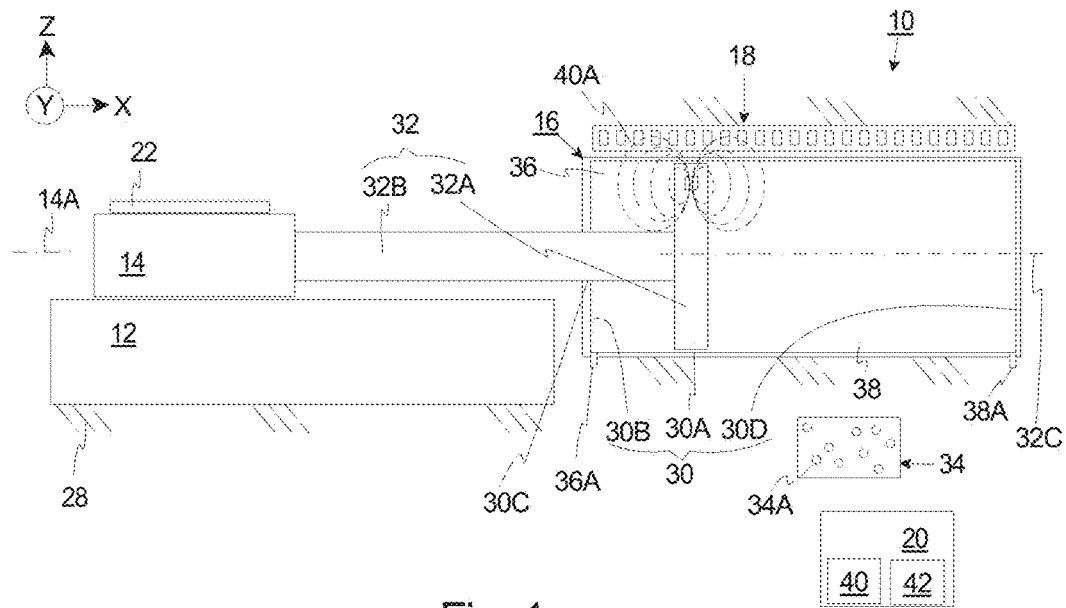
FIG. 1 is a simplified illustration of an embodiment of a stage assembly, in partial cut-away, the stage assembly including an actuator assembly having features of the present invention.
Figure 11:
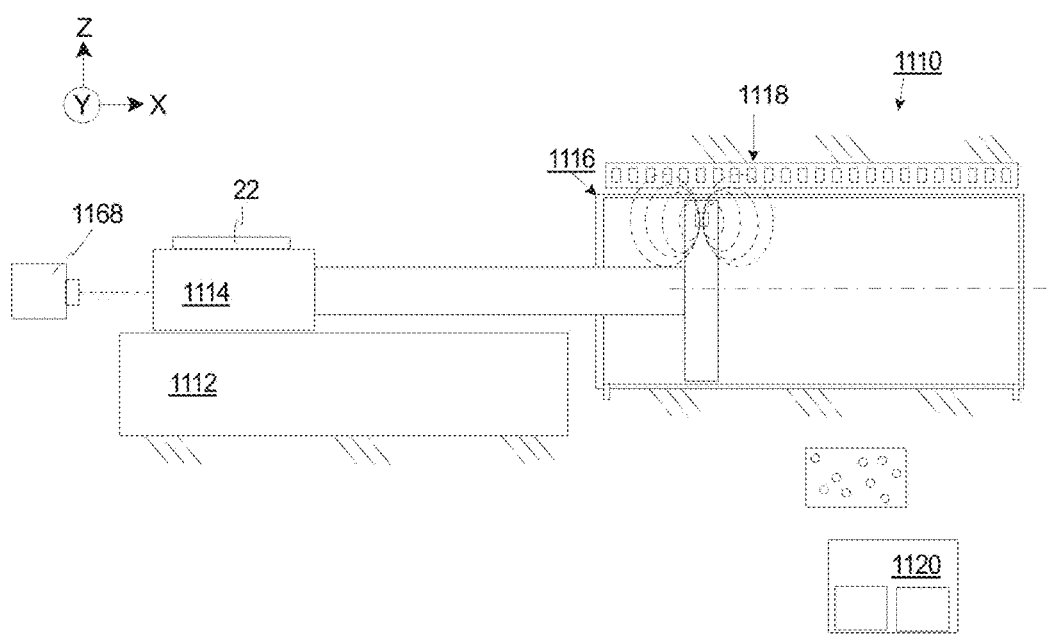
FIG. 11 is a simplified illustration of yet another embodiment of the stage assembly, in partial cut-away.

FIG. 1 is a simplified illustration of an embodiment of a stage assembly 10 having features of the present invention. In the embodiment shown in FIG. 1, the stage assembly 10 includes a base 12, a stage 14, and an actuator assembly 16 (in partial cutaway) that includes a measurement system 18 and a signal processor 20 (illustrated as a box). The design of each of these components can be varied to suit the design requirements of the stage assembly 10. As provided herein, the stage assembly 10 is particularly useful for precisely positioning a device 22 (or workpiece) during a manufacturing and/or an inspection process. The type of device 22 positioned and moved by the stage assembly 10 can be varied. For example, the device 22 can be a semiconductor wafer, or a reticle, and the stage assembly 10 can be used as part of an exposure apparatus 1124 (such as illustrated in FIG. 11) for precisely positioning the wafer or the reticle during manufacturing of the semiconductor wafer. Alternatively, for example, the actuator assembly 16 can be used as part of a fluid pump. Still alternatively, the actuator assembly 16 can be used to move other types of devices during manufacturing and/or inspection, to move a device under an electron microscope (not shown), or to move a device during a precision measurement operation (not shown).

As an overview, in certain embodiments, the measurement system 18 is a magnetic sensor system that accurately monitors the position and/or movement of the device 22, the stage 14 and/or certain components of the actuator assembly 16. Uniquely, the magnetic sensor system can monitor the movement of a mover component 32 of the actuator assembly 16 without the need for cables to be fed to the mover component 32. Consequently, the magnetic sensor system does not require power or sensor lines that must follow the mover component 32, and that could cause electrical safety or noise issues. Furthermore, the lack of cables eliminates forces exerted by these cables. The magnetic sensor system is therefore vibrationless, which is important for systems where extremely high accuracy is required, such as lithography systems. Moreover, the magnetic sensor system is relatively inexpensive to manufacture.

Some of the Figures provided herein include an orientation system that designates an X axis, a Y axis, and a Z axis. It should be understood that the orientation system is merely for reference and can be varied. For example, the X axis can be switched with the Y axis and/or the stage assembly 10 can be rotated. Moreover, these axes can alternatively be referred to as a first, second, or third axis.

The base 12 supports the stage 14 and can be any suitable structure. In FIG. 1, the base 12 is generally rectangular-shaped, is rigid, and is secured to a fixed, mounting structure 28.

The stage 14 retains the device 22. In the embodiment shown in FIG. 1, the stage 14 is precisely moved by the actuator assembly 16 to precisely position the stage 14 and the device 22. Additionally, in this embodiment, the stage 14 is generally rectangular-shaped and includes a device holder (not shown) for retaining the device 22. The device holder can be a vacuum chuck, an electrostatic chuck, or some other type of clamp. Further, the stage 14 can be supported relative to the base 12 with a bearing, e.g., a fluid or roller bearing.

The actuator assembly 16 moves the stage 14 and the device 22 relative to the base 12. The design of the actuator assembly 16 can be varied to suit the specific requirements of the stage assembly 10. In various embodiments, the actuator assembly 16 is a linear actuator assembly that is configured to move the stage 14 and the device 22 only along one axis. For example, in the non-exclusive embodiment illustrated in FIG. 1, the actuator assembly 16 moves the stage 14 along only a single, linear, stage axis 14A that is parallel to the X axis. Alternatively, the actuator assembly 16 could be designed to move the stage 14 along more than one axis, and/or about one or more axes. For example, in certain non-exclusive alternative embodiments, the actuator assembly 16 can include a planar motor that moves the stage 14 in the planar degrees of freedom (i.e. along the X axis, along the Y axis, and about the Z axis), or that moves the stage 14 in six degrees of freedom (i.e. along each of the X, Y and Z axes, and about each of the X, Y and Z axes).

In FIG. 1, the actuator assembly 16 includes a rigid, stator component 30 (illustrated in cut-away); the rigid, mover component 32 that is moved relative to the stator component 30; an actuator 34 that is controlled to selectively move the mover component 32 relative to the stator component 30; the measurement system 18; and the signal processor 20. The design of each of these components can be varied pursuant to the teachings provided herein.

In the non-exclusive embodiment illustrated in FIG. 1, the actuator assembly 16 includes a fluid piston. In this design, the stator component 30 includes a tubular-shaped stator body 30A; a disc-shaped, proximal stator end 30B having a shaft aperture 30C; and a disc-shaped, distal stator end 30D. Additionally, the mover component 32 includes a piston disc 32A positioned within the stator body 30A, and a piston shaft 32B that is attached to and cantilevers away from the piston disc 32A. Further, the piston shaft 32B extends through the shaft aperture 30C, and the piston shaft 32B is fixedly connected to the stage 14 so that the forces on the piston disc 32A are transferred to the stage 14. The proximal stator end 30B can include a seal (not shown) that seals a gap between the piston shaft 32B and the proximal stator end 30B. Additionally, the piston disc 32A can include a seal (not shown) that seals a gap between the piston disc 32A and the stator body 30A.

Moreover, in FIG. 1, the mover component 32 is moved relative to the stator component 30 along a mover axis 32C with the actuator 34. In this non-exclusive embodiment, the mover axis 32C is linear, coaxial with the stage axis 14A, and substantially parallel to the X axis.

With the design illustrated in FIG. 1, the mover component 32 cooperates with the stator component 30 to form a first chamber 36 that is on one side, e.g., to the left of, the piston disc 32A, and a second chamber 38 that is on the opposite side, e.g., to the right of, the piston disc 32A. Further, the first chamber 36 includes a first transfer port 36A that is in fluid communication with the actuator 34; and the second chamber 38 includes a second transfer port 38A that is also in fluid communication with the actuator 34.

In FIG. 1, the actuator 34 is a fluid source that directs fluid 34A (illustrated as small circles) into or out of the chambers 36, 38 via the transfer ports 36A, 38A to selectively control the pressure in each chamber 36, 38. With this design, the actuator assembly 16 is double-acting, and uses compressed fluid 34A in the chambers 36, 38 to generate a force on the piston disc 32A to selectively move the piston disc 32A linearly in either direction along the mover axis 32C. For example, the actuator, i.e. the fluid source, can include one or more pumps, reservoirs, and valves (not shown) that individually control the pressure of the fluid 34A in each of the chambers 36, 38.

Alternatively, the actuator 34 can be another type of linear actuator. For example, the actuator 34 can be a ball-screw motor or another type of actuator, or human power.

In FIG. 1, the stator component 30 is fixedly secured to the mounting structure 28. Alternatively, the stator component 30 can be secured to the mounting structure 28 using a reaction assembly (not shown) that counteracts, reduces and minimizes the influence of the reaction forces from the stator component 30 on the mounting structure 28. With such design, i.e. with both the base 12 and the stator component 30 being secured to the mounting structure 28, the mover component 32 can be said to move relative to the stator component 30 and/or the base 12.

The measurement system 18 monitors the position and/or movement of the mover component 32, and thus the device 22, relative to a measurement reference, e.g., the stator component 30, or another structure. In FIG. 1, the measurement system 18 monitors the movement or position of the mover component 32 (and the device 22) along the mover axis 32C. Thus, with information from the measurement system 18, the actuator 34 can be controlled by the signal processor 20 to precisely position the stage 14 and the device 22. The design of the measurement system 18 can be varied according to the movement requirements of the stage 14. Embodiments of the measurement system 18 are described in greater detail herein below.

In certain embodiments, as provided herein, the measurement system 18 generates one or more sensor signals that are used by the signal processor 20 to determine the position or monitor the movement of the mover component 32. Stated in another fashion, the signal processor 20 receives the sensor signals from the measurement system 18, and utilizes the sensor signals to accurately determine the position and/or monitor the movement of the mover component 32.

The signal processor 20 is also electrically connected to, directs and controls electrical current to the actuator 34 to precisely position the mover component 32 and the device 22 with feedback from the measurement system 18. With information regarding the movement or position of the mover component 32, the signal processor 20 can control the actuator 34 so that the device 22 follows a desired trajectory. The signal processor 20 can include one or more processors 40 and/or one or more electronic storage devices 42.

Figure 2A:
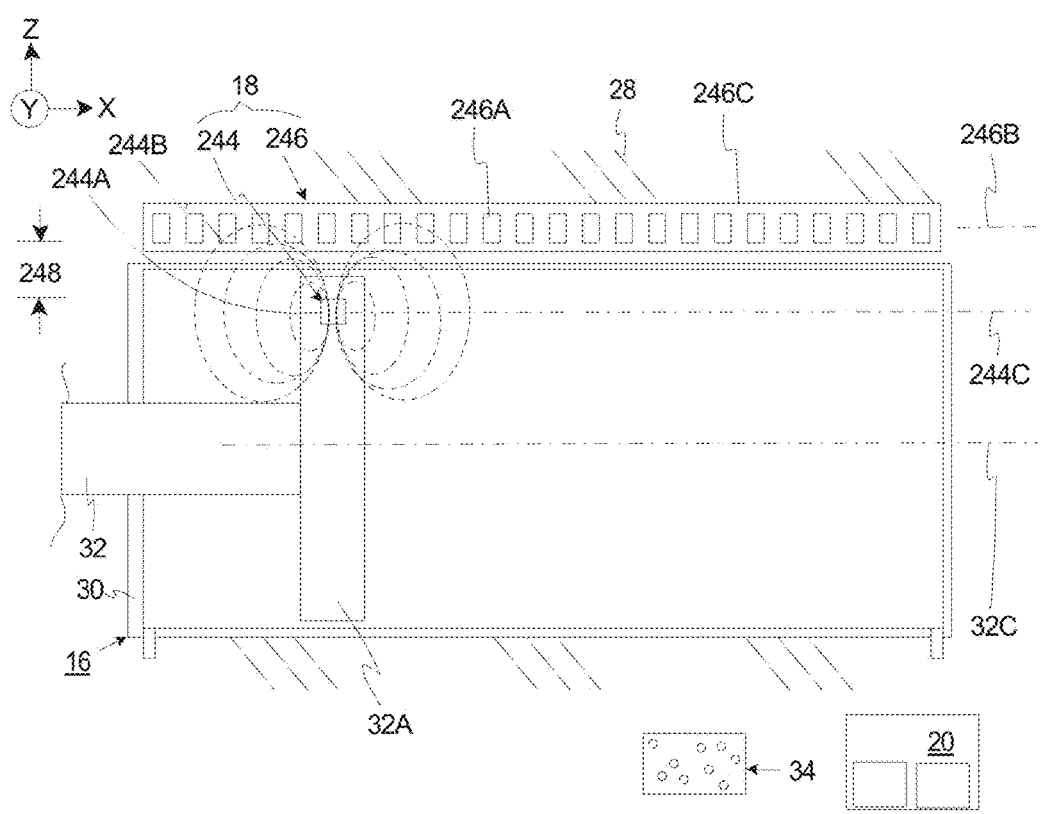
FIG. 2A is an enlarged, cut-away view of a portion of the actuator assembly illustrated in FIG. 1, with a mover component in a first position.

FIG. 2A is an enlarged, cut-away view of a portion of the actuator assembly 16 illustrated in FIG. 1, including the stator component 30, a portion of the mover component 32, the actuator 34, the measurement system 18 and the signal processor 20. Additionally, FIG. 2A illustrates the mover component 32 in a first position relative to the stator component 30.

As noted above, the design of the measurement system 18 can be varied. In various embodiments, the measurement system 18 includes a measurement magnet assembly 244 (also referred to herein simply as a "magnet assembly") that is secured to and moves with the mover component 32; and a sensor array 246. As illustrated, the magnet assembly 244 includes one or more magnets 244A that are configured to produce and/or generate a magnetic field 244B (illustrated with dashed ovals). In most embodiments, it is desired that that magnet assembly 244 be configured to produce and/or generate a consistent magnetic field 244B regardless of the position or orientation of the one or more magnets 244A in the magnet array 244. However, it is further appreciated that the magnet assembly 244 can be configured to alternatively produce and/or generate a changing magnetic field, so long as the shape of the magnetic field 244B is known at all times.

The design of the magnet assembly 244 can be varied to suit the specific requirements of the measurement system 18. For example, in some embodiments, the magnet assembly 244 can include one or more permanent magnets 244A that are surrounded by the magnetic field 244B. In the specific embodiment illustrated in FIG. 2A, the magnet assembly 244 includes a single permanent magnet 244A that produces and/or generates the magnetic field 244B. Alternatively, the magnet assembly 244 can include a plurality of magnets, e.g., permanent magnets, that are arranged in an array, e.g., in a Halbach array. Still alternatively, the magnet assembly 244 can include one or more electromagnets. As noted, it is simply desired that the magnet assembly 244 be configured to produce and/or generate a magnetic field 244B that is consistent and/or whose shape is known at all times. In certain embodiments, the magnetic field 244B has a known, predetermined shape. Further, in some embodiments, the magnet assembly 244 is only used for measurement and not for directly moving the mover component 32.

In the embodiment illustrated in FIG. 2A, the magnet assembly 244 is moved along a magnet axis 244C during movement of the mover component 32. Further, in this embodiment, the magnet axis 244C is linear, and parallel to and spaced apart from the mover axis 32C.

As shown in FIG. 2A, the sensor array 246 includes a plurality of spaced apart magnetic sensors 246A. Further, the sensors 246A are positioned to be within the magnetic field 244B of the magnet assembly 244 during at least a portion of the movement of the magnet assembly 244 along the magnet axis 244C. In the non-exclusive embodiment illustrated in FIG. 2A, the spaced apart sensors 246A are aligned along a sensor axis 246B. Further, in this embodiment, the sensor axis 246B is parallel to and spaced apart from the mover axis 32C and the magnet axis 244C. However, the sensors 246A do not need to be placed linearly and can follow any trajectory, provided their global positions are known or determined relative to the measurement reference, e.g. the stator component 30, and provided that the sensors 246A are positioned in the magnetic field 244B during at least a portion of the movement of the magnet assembly 244.

In certain embodiments, as shown, the sensors 246A can be aligned linearly and can be positioned spaced apart a separation distance 248 from the magnet assembly 244 along the Z axis. In such embodiments, the separation distance 248 between the magnet 244A and the sensors 246A along the Z axis can be varied, which can also impact the strength of the magnetic field 244B as sensed by the sensors 246A. In some such embodiments, the separation distance 248 between the magnet 244A and the sensors 246A along the Z axis can be between approximately five millimeters and ten millimeters. For example, in certain non-exclusive alternative embodiments, the separation distance 248 between the magnet 244A and the sensors 246A along the Z axis can be approximately five, six, seven, eight, nine or ten millimeters. Alternatively, in other embodiments, the separation distance 248 between the magnet 244A and the sensors 246A along the Z axis can be greater than ten millimeters or less than five millimeters.

It is appreciated that, in general, the closer the sensors 246A are to the magnet 244A, i.e. the smaller the separation distance 248, the better the sensor signal will be, and the less noise will be seen in the estimated position of the mover component 32.

In FIG. 2A, the sensor array 246 is fixedly secured to the mounting structure 28, and the stator component 30 is also fixedly secured to the mounting structure 28. Thus, in such embodiment, the sensor array 246 is fixed in position relative to the stator component 30. Further, in FIG. 2A, the magnet assembly 244 is fixedly secured to (e.g., embedded within) the piston disc 32A. With this design, the mover component 32 and the magnet assembly 244 move relative to the fixed stator component 30 and the fixed sensor array 246.

The design of the sensors 246A can be varied. For example, each sensor 246A can be a transducer (e.g., a hall effect sensor) that generates a sensor signal based on the magnetic field 244B that is sensed by the sensors 246A. More specifically, in such embodiments, each sensor 246A can generate a sensor signal that varies its output voltage in response to the changing magnetic field 244B from the magnet assembly 244 as the mover component 32 is moved relative to the sensors 246A.

Further, the number and spacing of the sensors 246A in the sensor array 246 can be varied to achieve the desired range and sensitivity, respectively, of the measurement system 18. In FIG. 2A, the sensor array 246 includes twenty-four spaced apart sensors 246A that are densely positioned linearly. Alternatively, the sensor array 246 can be designed to include greater than twenty-four or fewer than twenty-four spaced apart sensors 246A. With the present design, there is no theoretical limit to the length in which the measurement system 18 can measure, as more sensors 246A can just be placed (added) to extend the measurement range.

It is appreciated that, in certain embodiments, the measurement system 18 is configured to only utilize a subset of the total number of sensors 246A of the sensor array 246 at any given position of the mover component 32. For example, in such embodiments, the measurement system 18 can be configured to only utilize the sensors 246A that are determined to be in the active region of the moving magnetic field 244B at any given position of the mover component 32. With this design, the measurement system 18 has reduced computational requirements versus a comparable system that utilizes all of the sensors 246A, especially in a measurement system 18 that includes a greater number of sensors 246A.

In FIG. 2A, for ease of discussion, the sensors 246A can be labeled or designated as sensors one through twenty-four moving left to right. As shown in FIG. 2A, at the first position of the mover component 32, the third, fourth, fifth, seventh, eighth and ninth sensors 246A are currently positioned in the magnetic field 244B, and the third through ninth sensors 246A each provide a sensor signal that can be used by the signal processor 20 to determine the position of the magnet 244A and the mover component 32.

Figure 2B:
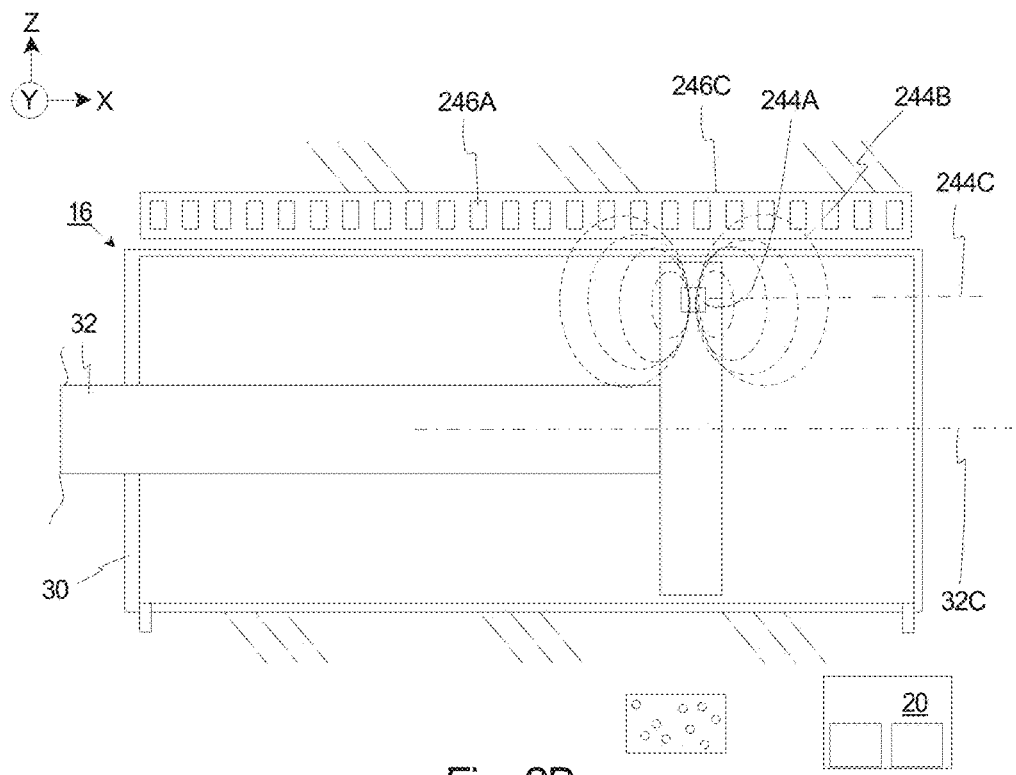
FIG. 2B is an enlarged, cut-away view of a portion of the actuator assembly illustrated in FIG. 1, with the mover component in a second position.

FIG. 2B is another enlarged, cut-away view of the portion of the actuator assembly 16 of FIG. 1 with the mover component 32 moved to the right along the mover axis 32C from FIG. 2A. More specifically, FIG. 2B illustrates the mover component 32 in a second position relative to the stator component 30. As shown in FIG. 2B, at the second position of the mover component 32, the fifteenth, sixteenth, nineteenth, twentieth and twenty-first sensors 246A are positioned in the magnetic field 244B from the magnet 244A, and the fifteenth through twenty-first sensors 246A each provide a separate sensor signal that can be used by the signal processor 20 to determine the position of the mover component 32.

With reference to FIGS. 2A and 2B, as the mover component 32 is moved back and forth along the mover axis 32C, and the magnet 244A is moved back and forth along the magnet axis 244C, the sensors 246A detect the magnetic field 244B from the magnet 244A that is embedded in the mover component 32. Thus, at any given point in the stroke of the mover component 32, one or more sensors 246A will be in the active region of the magnet 244A and will be able to see the shape of the magnetic field 244B created by the magnet 244A as it moves by the sensors 246A.

The space between adjacent sensors 246A influences the sensitivity of the measurement system 18 and can be varied in view of the size of the magnetic field 244B. At a minimum, one sensor 246A must be in the active magnetic field 244B of the magnet assembly 244 at any given time in order to perform the bare minimum of a one-dimensional table look-up. However, additional sensors 246A in the active magnetic field 244B at any given time can improve the accuracy of measurement. As non-exclusive examples, the spacing between adjacent sensors 246A can be approximately three, four, five, six, seven or ten millimeters.

In one embodiment, the sensors 246A can be mounted on a printed circuit board 246C or other structure. With such design, it is appreciated that the precise location of the sensors 246A may not be accurately known. Thus, it can be desired to develop a mapping system for the position of each of the sensors 246A. One, non-exclusive example of the mapping of the position of each sensor 246A is described herein below.

As provided herein, the signal processor 20 receives the sensor signals from the sensors 246A and estimates the position of the magnet assembly 244 and the mover component 32 along the mover axis 32C based on one or more of these sensor signals.

Figure 3:
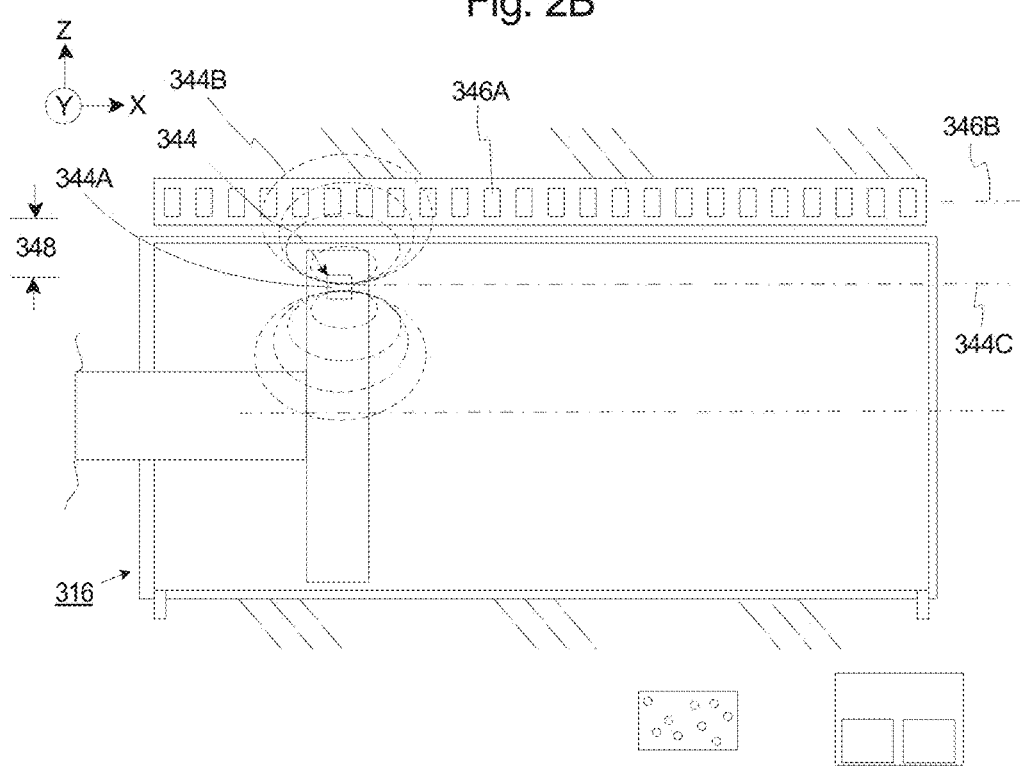
FIG. 3 is an enlarged, cut-away view of a portion of another embodiment of the actuator assembly, with the mover component in the first position.

It should be noted that in FIGS. 2A and 2B, the magnet 244A is cylindrical-shaped and has a perpendicular orientation (north and south poles are perpendicular) relative to the magnet axis 344C. However, the magnet 244A can have a different shape and/or positioning than illustrated in FIGS. 2A and 2B. For example, FIG. 3 is an enlarged, cut-away view of a portion of another embodiment of the actuator assembly 316. In this embodiment, the magnet 344A is cylindrical-shaped and has an axial orientation (the north and south poles are parallel) relative to the magnet axis 344C.

FIG. 3 further illustrates that the sensors 346A can again be spaced apart and aligned linearly along the sensor axis 346B and can be positioned spaced apart a separation distance 348 from the magnet assembly 344 along the Z axis.

With reference to FIGS. 2A, 2B and 3, the type of waveform or shape generated by the magnetic fields 244B, 344B and received by the sensors 246A, 346A will change based on the orientation, size, and shape of the magnet 244A, 344A. For instance, in these examples, the magnet 244A, 344A can be placed such that the magnetic field 344A, 344B is either axially or perpendicularly oriented to the stroke direction, i.e. relative to the mover axis 32C.

Figure 4:
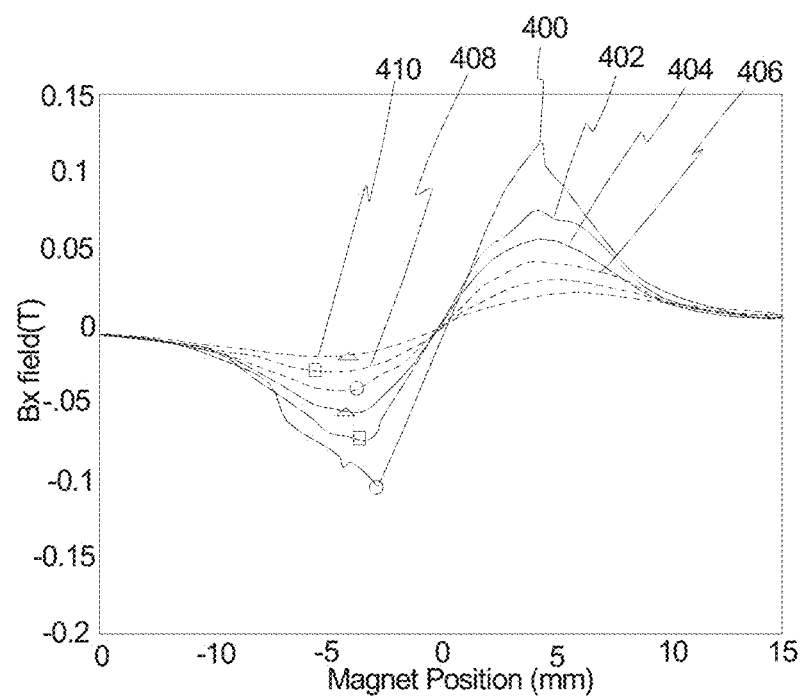
FIG. 4 is a graph that illustrates magnetic flux density measured by a sensor versus position for the actuator assembly illustrated in FIG. 3.

FIG. 4 is a graph that illustrates magnetic flux density measured by a single sensor 346A versus position of the magnet 344A along the magnet axis 344C for the embodiment illustrated in FIG. 3. In particular, FIG. 4 includes six separate curves with each curve representing a different separation distance 348 between the magnet 344A and the sensor 346A along the Z axis. More specifically, in this example, (i) curve 400 (illustrated as a solid line with a circle along the line) represents the sensor signal provided by the sensor 346A versus magnet 344A position when the magnet 344A is spaced apart from the sensor 346A along the Z axis by a separation distance 348 of five millimeters; (ii) curve 402 (illustrated as a solid line with a square along the line) represents the sensor signal provided by the sensor 346A versus magnet 344A position when the magnet 344A is spaced apart from the sensor 346A along the Z axis by a separation distance 348 of six millimeters; (iii) curve 404 (illustrated as a solid line with a triangle along the line) represents the sensor signal provided by the sensor 346A versus magnet 344A position when the magnet 344A is spaced apart from the sensor 346A along the Z axis by a separation distance 348 of seven millimeters; (iv) curve 406 (illustrated as a dashed line with a circle along the line) represents the sensor signal provided by the sensor 346A versus magnet 344A position when the magnet 344A is spaced apart from the sensor 346A along the Z axis by a separation distance 348 of eight millimeters; (v) curve 408 (illustrated as a dashed line with a square along the line) represents the sensor signal provided by the sensor 346A versus magnet 344A position when the magnet 344A is spaced apart from the sensor 346A along the Z axis by a separation distance 348 of nine millimeters; and (vi) curve 410 (illustrated as a dashed line with a triangle along the line) represents the sensor signal provided by the sensor 346A versus magnet 344A position when the magnet 344A is spaced apart from the sensor 346A along the Z axis by a separation distance 348 of ten millimeters.

In the axial orientation of the magnet 344A, the waveform or shape of the magnetic field 344B as sensed by the sensor 346A looks similar to a sine wave, but with leading and trailing edges. Further, the amplitude of the sensor signal is increased as the separation distance 348 is decreased.

Figure 5:
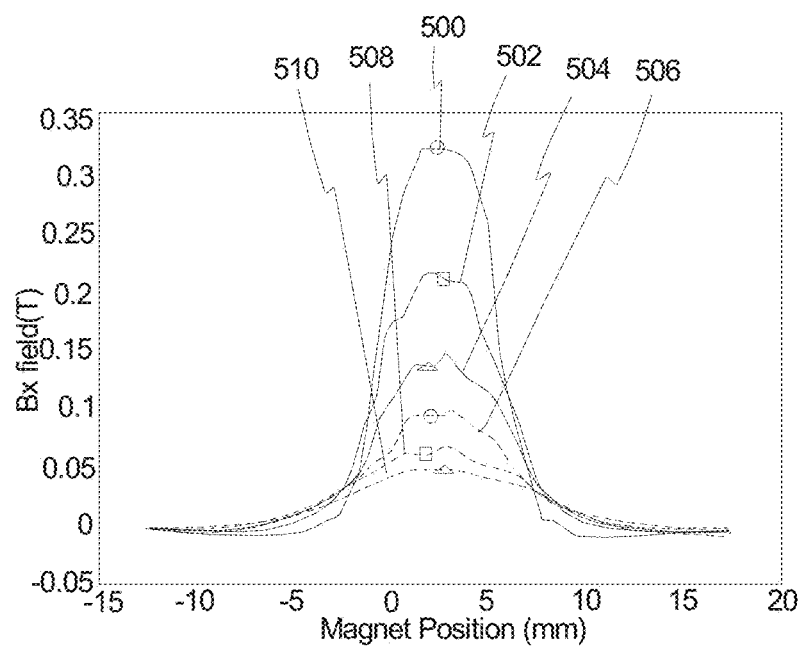
FIG. 5 is a graph that illustrates magnetic flux density measured by a sensor versus position for the actuator assembly illustrated in FIG. 2A.

FIG. 5 is a graph that illustrates magnetic flux density measured by a single sensor 246A versus position of the magnet 244A along the magnet axis 244C for the embodiment illustrated in FIG. 2A. In particular, FIG. 5 includes six separate curves with each curve representing a different separation distance 248 between the magnet 244A and the sensor 246A along the Z axis. More specifically, in this example, (i) curve 500 (illustrated as a solid line with a circle along the line) represents the sensor signal provided by the sensor 246A versus magnet 244A position when the magnet 244A is spaced apart from the sensor 246A along the Z axis by a separation distance 248 of five millimeters; (ii) curve 502 (illustrated as a solid line with a square along the line) represents the sensor signal provided by the sensor 246A versus magnet 244A position when the magnet 244A is spaced apart from the sensor 246A along the Z axis by a separation distance 248 of six millimeters; (iii) curve 504 (illustrated as a solid line with a triangle along the line) represents the sensor signal provided by the sensor 246A versus magnet 244A position when the magnet 244A is spaced apart from the sensor 246A along the Z axis by a separation distance 248 of seven millimeters; (iv) curve 506 (illustrated as a dashed line with a circle along the line) represents the sensor signal provided by the sensor 246A versus magnet 244A position when the magnet 244A is spaced apart from the sensor 246A along the Z axis by a separation distance 248 of eight millimeters; (v) curve 508 (illustrated as a dashed line with a square along the line) represents the sensor signal provided by the sensor 246A versus magnet 244A position when the magnet 244A is spaced apart from the sensor 246A along the Z axis by a separation distance 248 of nine millimeters; and (vi) curve 510 (illustrated as a dashed line with a triangle along the line) represents the sensor signal provided by the sensor 246A versus magnet 244A position when the magnet 244A is spaced apart from the sensor 246A along the Z axis by a separation distance 248 of ten millimeters.

In the perpendicular (bottom) orientation of the magnet 244A, the waveform or shape of the magnetic field 244B as sensed by the sensors 246A looks Gaussian-like in nature. Comparing FIGS. 4 and 5, both waveforms or shapes offer different advantages and disadvantages and can be uniquely valuable depending on the application. Furthermore, a permanent magnet can be used that has a pre-determined shape, such as a Halbach array, that can ease position determination.

As noted above, in one embodiment, the location of each of the sensors 246A, 346A is not accurately known because of manufacturing tolerances of the printed circuit board 246C on which the sensors 246A, 346A are mounted. Thus, in such embodiment, it is desired to provide a system that can accurately map the position of each of the sensors 246A, 346A. For example, in such embodiment, as provided herein, a calibration measurement system 760 (illustrated in FIG. 7, and with well-known properties such as a linear encoder) can be used temporarily to measure and map the position of the mover component 32 along the mover axis 32C. Calibration measurement data from the calibration measurement system 760 can later be used to calculate the manufacturing errors and to calibrate the sensors 246A, 346A. In one embodiment, a sensor position calibration is performed in which the position of each sensor 246A, 346A can be mapped by moving the mover component 32 back and forth along the mover axis 32C throughout the entire range of travel, while monitoring the sensor signal from each sensor 246A, 346A and a mapping signal from the calibration measurement system 760 with the signal processor 20. With this design, the calibration measurement system 760 can provide calibration measurement data which references the position where the peak signal for each sensor is reached. For example, for the magnet 244A orientation illustrated in FIG. 2A, each of the sensors 246A will detect a Gaussian-like waveform or shape when the magnet 244A is moved back and forth. For a Gaussian-like waveform, the center position of each sensor 246A is at the peak of its sensor signal. With this design, as the magnet 244A has been moved throughout the entire range of travel, the raw sensor data from each of the sensors 246A is collected, and the calibration measurement data is collected from the calibration measurement system 760. The raw sensor data and the calibration measurement data can then be reviewed (either manually or via the signal processor 20) to determine the center position of each sensor 246A based on the peak signal for each sensor 246A. In certain embodiments, the sensor position calibration is only required once to determine absolute sensor 246A position and is no longer needed thereafter.

Figure 6:
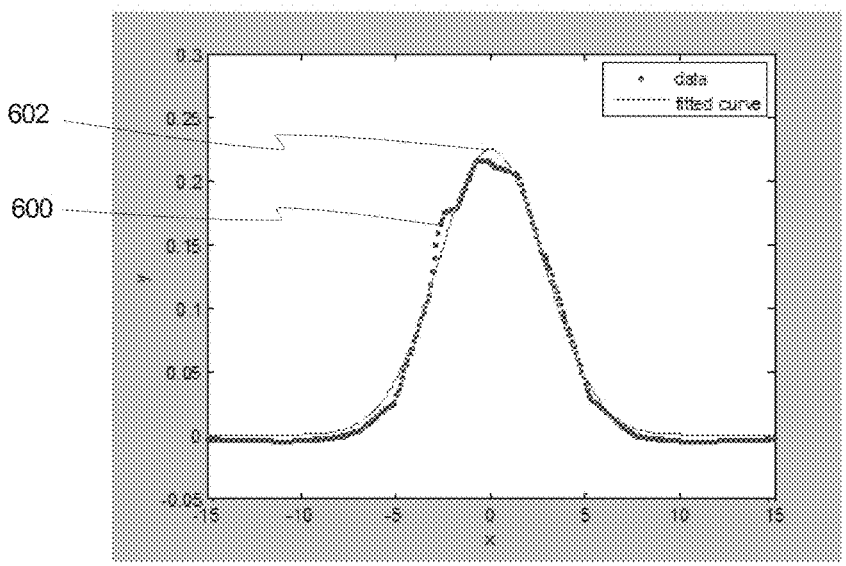
FIG. 6 is a Gaussian model graph created from sensor signals from one sensor.

Additionally or alternatively, a sensor response calibration can be performed on each of the sensors 246A. As is known, because of manufacturing tolerances, the voltage response to the magnet 244A from each of the sensors 246A is slightly different. In one embodiment, a sensor response calibration is performed in which the response of each sensor 246A is mapped by moving the mover component 32 back and forth along the mover axis 32C throughout the entire range of travel, while monitoring the sensor signal from each sensor 246A and monitoring the position with the calibration measurement system 760 using the signal processor 20. For example, for the magnet 244A orientation illustrated in FIG. 2A, each of the sensors 246A will detect a Gaussian-like waveform or shape when the magnet 244A is moved back and forth. More specifically, FIG. 6 is a graph that illustrates a plurality of sensor signals 600 ("sensor data") that were generated by a sensor 246A when the mover component 32 was moved along the mover axis 32C, and thus the magnet 244A was moved along the magnet axis 244C. The sensor data 600 forms a fitted curve that is approximately Gaussian-shaped. A fitted curve 602 that is Gaussian-shaped is also illustrated in FIG. 6. As such, the fitted curve 602 may also be referred to herein as a Gaussian-like curve.

For each sensor 246A, a coefficient of the curve-fitting can be determined (manually or via the signal processor 20) using its respective sensor data 600. In one embodiment, for each sensor 246A, the Gaussian-like curve 602 can be mapped with one or more coefficient parameters. For example, for each sensor 246A, the Gaussian-like curve 602 can be individually mapped using three coefficient parameters, namely a height of the curve's peak, a position of the center of the peak, and the standard deviation of the peak. After the curve 602 is mapped for each sensor 246A, this response map can be used by the signal processor to determine magnet location based on the sensor response from each sensor 246A.

It should be noted that the type of curve-fitting used can vary based on the shape of waveform and the number of sensors 246A in the active field 244B, so many solutions for position can be determined for any given magnet/sensor array set up.

After the position and response of the sensors 246A are determined, as non-exclusive examples, the signal processor 20 can use a look-up table and/or an appropriate curve-fitting method to determine position of the magnet 244A based on one or more sensor signals.

Figure 7:
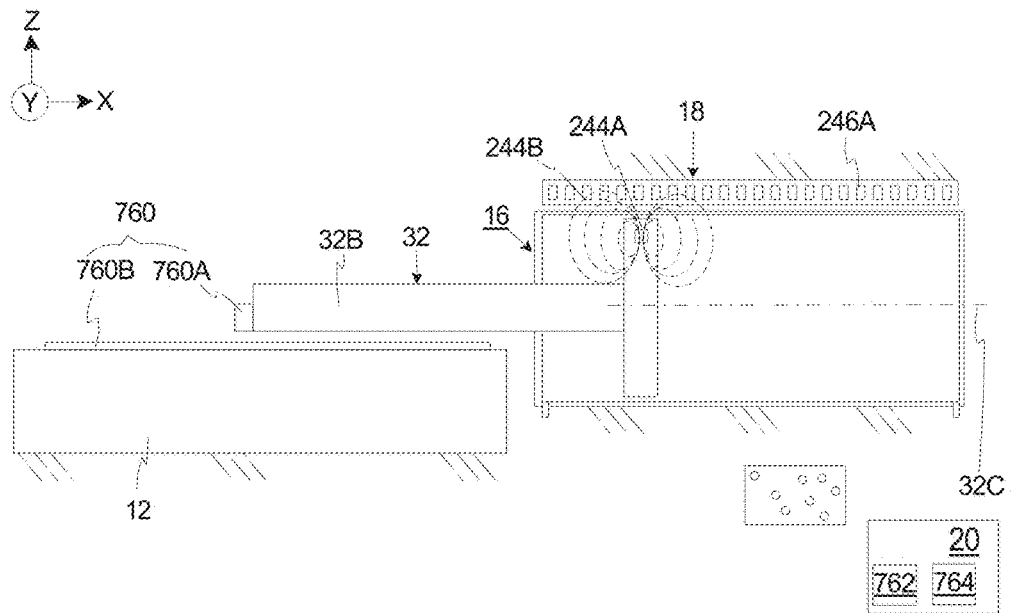
FIG. 7 is a simplified illustration of the actuator assembly and a calibration measurement system.

As noted, in certain embodiments, the accuracy of the measurement system 18 can be improved with calibration using a very accurate, temporary, secondary measurement system. FIG. 7 is a simplified illustration of the actuator assembly 16 and the calibration measurement system 760 that can be used to map and calibrate the measurement system 18. As a non-exclusive example, the calibration measurement system 760 can be a linear encoder, or another type of sensor. In FIG. 7, the calibration measurement system 760 is a linear encoder that includes an encoder reader 760A that is temporarily secured to the piston shaft 32B and a linear grid 760B that is temporarily secured to the base 12. With this design, the measurement system 18 can be calibrated by moving the mover component 32 back and forth along the mover axis 32C, while monitoring the sensor signal from each sensor 246A with the signal processor 20 and monitoring the position information from the calibration measurement system 760. It should be noted that after calibration, the calibration measurement system 760 can be removed.

In the embodiment in which the signal processor 20 uses a look-up table to determine position, the look-up table 762 (illustrated as a box) can be generated (mapped) by moving the mover component 32 back and forth along the mover axis 32C, while monitoring the sensor signal from each sensor 246A with the signal processor 20 and monitoring the positioned information from the calibration measurement system 760. With this design, the look-up table 762 is a table that correlates the accurate position information from the calibration measurement system 760 to the various sensor signals from the sensors 246A. Subsequently, after the calibration measurement system 760 has been removed, the signal processor 20 can use the various sensor signals and the look-up table 762 to accurately determine the position of the magnet 244A. However, in certain designs, the look-up table 762 method can be computationally complex because the signal processor 20 is correlating multiple sensor signals to the look-up table 762.

As noted above, at a minimum, one sensor 246A must be in the active magnetic field 244B of the magnet assembly 244 and generating a non-zero sensor signal to provide positional information. However, in order to reduce noise/sensitivity issues, two or more sensors 246A with non-zero sensor signals will improve the accuracy of the measurement system 18.

For a curve-fitting method, the initial position can be estimated with the signal processor 20 using the sensor signals from the sensors 246A without using the calibration measurement system 760. However, the accuracy of the initial position information can be improved by calibration with the calibration measurement system 760. In this embodiment, the mover component 32 is moved along the mover axis 32C while comparing the initial position estimated from the sensors 246A with the signal processor 20 for each location to the calibration positioned information from the calibration measurement system 760. From this information, an error map 764 (illustrated as a box) can be generated that represents the difference between the initial position signals from the sensors 246A, and the calibrated position from the calibration measurement system 760. Subsequently, after the calibration measurement system 760 is removed, the signal processor 20 can use the initial position information generated from the sensor signals and the error map 764 to provide an accurate position of the magnet 244A.

It should be noted that if curve-fitting is used, the minimum number of sensors 246A in the active magnetic field 244B is determined by the number required to unambiguously determine the shape of the waveform. For instance, if the magnet 244A generates a Gaussian-like waveform or shape, a minimum of two sensors 246A are needed in the active magnetic field 244B in order to unambiguously determine the center position of the magnet 244A. This is because for a Gaussian-like curve, positions on opposite sides of the peak will have similar voltages.

In yet another embodiment, the signal processor 20 can use a triangle curve-fitting method to estimate the position of the magnet 244A from a plurality of sensor signals. The triangle curve-fitting method is insensitive to power supply drift, which would affect the offset voltages of all the sensors. Further, the triangle algorithms are also insensitive to changes in distance (along the Z axis) from the magnet 244A. Finally, the triangle curve-fitting method is insensitive to changes in the magnet diameter, or a widening or thinning of the field curve.

Figure 8:
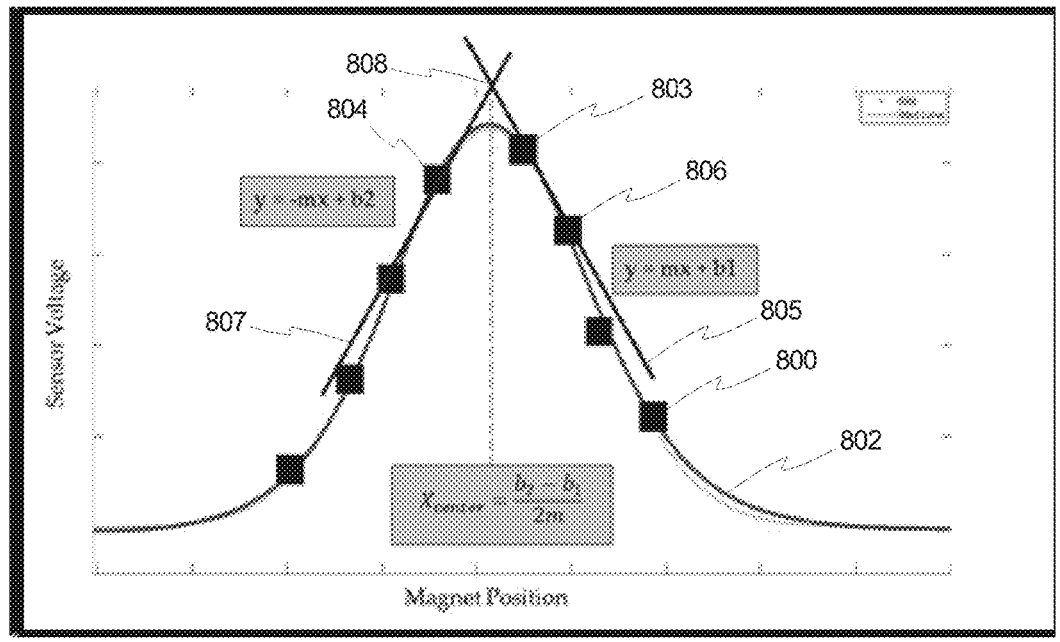
FIG. 8 is a first graph that illustrates eight generated sensor signals and an estimated magnet position.
Figure 9:
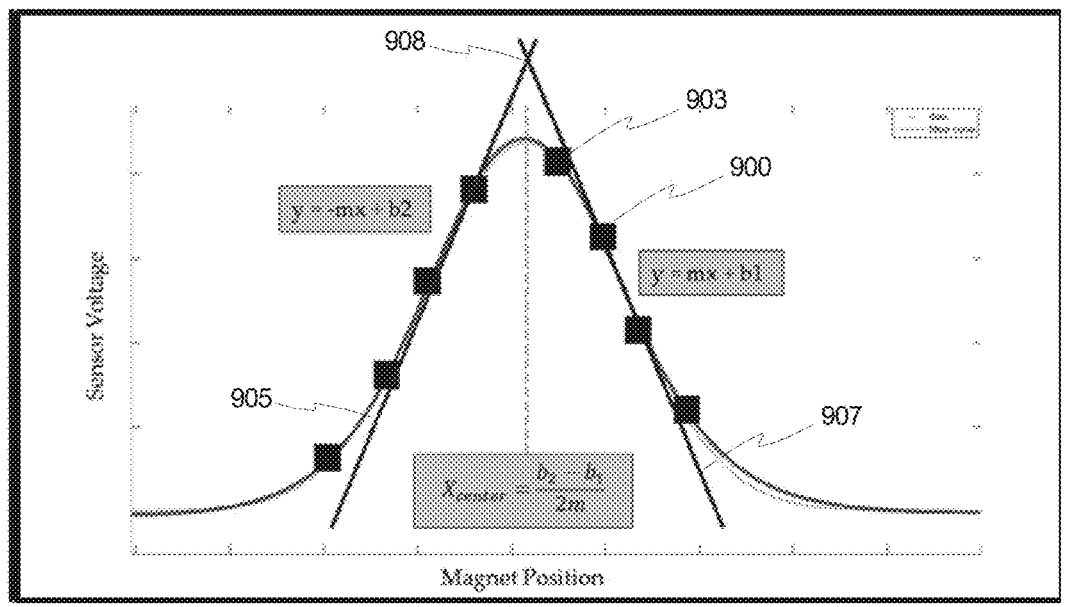
FIG. 9 is a second graph that illustrates eight generated sensor signals and an estimated magnet position.

A couple of triangle curve-fitting methods are provided herein, as shown in FIGS. 8 and 9. Each triangle curve-fitting method fits an isosceles triangle to the magnetic field 244B detected by the sensors 246A. The center of that triangle, or the intersection of the lines that form the two equal sides, is then used as the position of the magnet 244A.

The triangle curve-fits also have a simpler initial calibration than the Gaussian curve-fits. The only two steps are sensor offset correction (measuring the sensor output at 0 field and adding a correction factor) and sensor position correction (measuring the location of the magnet 244A when the peak field is detected at a given sensor 246A). Conversely, the Gaussian-fit calibrations require the calculation of two additional coefficients related to the width of the field curve and the height of the field curve.

With reference to FIG. 8, in a first triangular method (also referred to as an apex method) for estimating magnet position, at a given point in time, the three strongest (highest voltage) sensor signals 800 are used by the signal processor to determine position of the magnet. In FIG. 8, the eight largest sensor signals 800 are illustrated as squares. The fitted curve 802 is also illustrated in FIG. 8.

Initially, two lines are calculated, each through the highest value sensor 803. The first line (not shown) is calculated using the highest value sensor 803 and the sensor value 804 to the left while the second line 805 is calculated using the highest value sensor 803 and the sensor 806 to the right. The line (805 in this example) with the highest absolute value of slope among the two calculated lines is chosen as the primary fit line 805. Next, a secondary fit line 807 is calculated using the negative slope of the primary fit line 805 and the leftover sensor 804 not used in the primary fit line 805. Finally, the calculated intersection 808 of the primary fit line 805 and secondary fit line 807 is used as the position output.

FIG. 9 illustrates a second triangular method (referred to as a side triangular method) for estimating magnet position. In one embodiment, the side method looks at the signals 900 from four sensors to calculate position, namely two on the right side of the highest value sensor 903 and the two on the left side of the highest value sensor 903. The two sensors with the lowest output sum are chosen to calculate the primary fit line 905. Next, a secondary fit line 907 is calculated using the negative slope of the primary fit line 905 and the greatest of the two left over hall sensors not used in the primary fit line 905. Finally, the calculated intersection 908 of the primary fit line 905 and secondary fit line 907 is used as the position output.

In the non-exclusive examples provided above, the primary fit line 805, 905 is selected from two lines that are created from two sets of sensor signals 800, 900. Next, the line with greater absolute value slope is selected as the primary fit line 805, 905 because a steeper slope value is less affected by noise in the sensor value. Also, in the Apex Method, if the steeper slope line is not selected as the primary fit line 805, there would be some cases when the slope of the fit line would approach and possibly become zero. As the slope of the fit line approaches zero, the intersection position approximation gets far less accurate and when it becomes zero, the intersection would be calculated as the intersection between two parallel lines which would have no solution. The selection of the steeper slope for the primary fit line eliminates this possibility.

As a summary, the problem of measuring the displacement of a mover component 32 without having cables on the mover component 32 that can cause vibration forces is solved by placing a magnet 244A, e.g., a permanent magnet, with a magnetic field of a known shape on the mover component 32 and a sensor array 246, e.g., an array of hall sensors, on the stator component 30, and then measuring the magnetic field of the magnet 244A using the sensor array 246 to track the position of the mover component 32. One advantage of the measurement system 18 described in detail herein is that the measurement system 18 has no limitation for stroke length, as more sensors 246A can be placed to extend stroke range. The measurement system 18 can also be used for more complex trajectories, such as curved or non-linear trajectories, provided an accurate mapping of the sensor 246A locations can be provided. Further, the measurement system 18 is relatively inexpensive, as off-the-shelf components can be used for it (magnets and hall sensors) with some calibration. Moreover, the present measurement system 18 could theoretically be applied to two-dimensional or three-dimensional applications, although curve-fitting and sensor location become much more complex. Such application of the measurement system 18 will be described herein in relation to FIGS. 10A-10C.

Figure 10A:
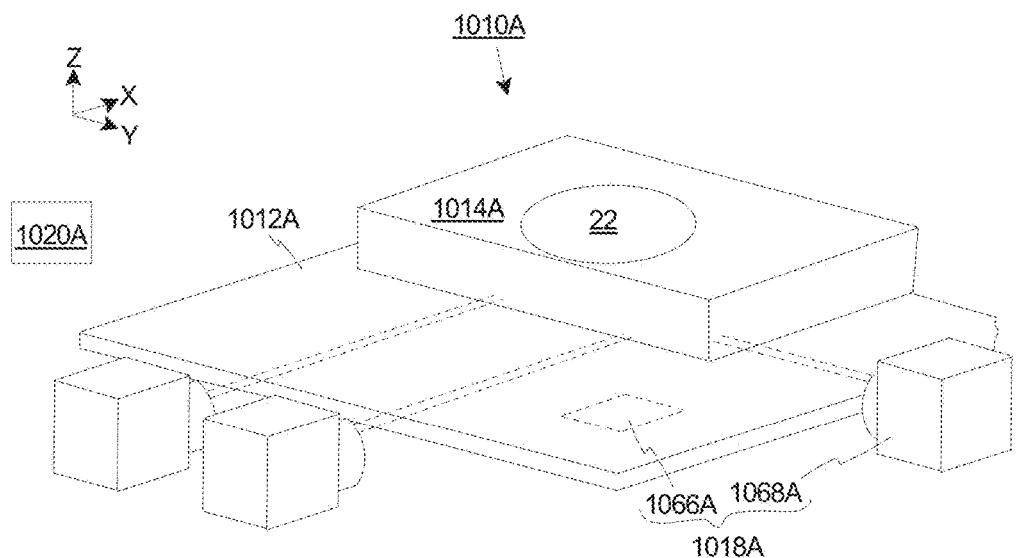
FIG. 10A is a simplified perspective view illustration of another embodiment of the stage assembly.

FIG. 10A is a simplified perspective illustration of another embodiment of the stage assembly 1010A. In particular, in this embodiment, the stage assembly 1010A includes a base 1012A, a stage 1014A, and an actuator assembly 1016A that includes a measurement system 1018A and a signal processor 1020A (or control system, illustrated as a box).

In this embodiment, the measurement system 1018A is somewhat different than in the previous embodiments. For example, as shown in FIG. 10A, the measurement system 1018A utilizes both a magnetic sensor system 1066A, such as described in detail herein above (e.g. a hall sensor system, only a portion is illustrated in phantom), and a second sensor system 1068A (only a portion is shown in the Figures) that cooperate to monitor the position of the stage 1014A. In certain embodiments, the second sensor system 1068A (only a portion is shown in FIG. 10A) is used in the primary control of the actuator assembly 1016A. Further, in certain embodiments, the magnetic sensor system 1066A can be used during system initialization and/or when the signal from the second system 1068A is lost. Many times during initialization of the stage assembly 1010A, the angle of the stage 1014A is too much to get an accurate measurement with the second sensor system 1068A. Further, water or other environmental factors can block the signal from the second sensor system 1068A or the stage 1014A can be moved out of the range of the second sensor system 1068A. At these times, the magnetic sensor system 1066A can be used to control the actuator assembly 1016A. Further, the magnetic sensor system 1066A can be used when less accuracy is required. In some embodiments, the magnetic sensor system 1066A is configured to only provide measurement information along a single axis, such as was described in detail above. Thus, in some such embodiments, the measurement system 1018A can utilize a plurality of magnetic sensor system 1066A in order to provide measurement information in greater than one degree of freedom. Alternatively, the placement of sensors within the magnet sensor system 1066A can be much more complex, and much more complex curve-fitting methods can be employed to enable the magnetic sensor system 1066A to provide measurement information in greater than one degree of freedom.

Moreover, in certain embodiments, the second sensor system 1068A can be used to improve the accuracy of the magnetic sensor system 1066A. For example, the second sensor system 1068A can be used to calibrate the magnetic sensor system 1066A.

In this embodiment, the base 1012A is coupled to the actuator assembly 1016A, receives reaction forces generated by the actuator assembly 1016A, and can be any suitable structure. In FIG. 10A, the base 1012A is generally rectangular-shaped and is rigid. In certain embodiments, the base 1012A can be a reaction assembly that counteracts, reduces and minimizes the influence of the reaction forces from the actuator assembly 1016A on the position of other structures.

As with the previous embodiments, the stage 1014A retains the device 22. In one embodiment, the stage 1014A is precisely moved by the actuator assembly 1016A to precisely position the stage 1014A and the device 22. In FIG. 10A, the stage 1014A is generally rectangular-shaped and includes a device holder (not shown) for retaining the device 22. The device holder can be a vacuum chuck, an electrostatic chuck, or some other type of clamp.

The measurement system 1018A monitors the movement and/or the position of the stage 1014A relative to a reference, such as an optical assembly (not shown in FIG. 1A). With this information, the actuator assembly 1016A can be controlled by the signal processor 1020A to precisely position the stage 1014A. Additionally, in certain embodiments, the measurement system 1018A utilizes (i) the magnetic sensor system 1066A that monitors the movement of the stage 1014A, and (ii) the second sensor system 1068A that also monitors the movement of the stage 1014A.

In one embodiment, the actuator assembly 1016A moves the stage 1014A along the X, Y, and Z axes, and about the X, Y, and Z axes (six degrees of freedom). In such embodiment, the magnetic sensor system 1066A monitors the movement or position of the stage 1014A along the X, Y, and Z axes, and about the X, Y, and Z axes (six degrees of freedom); and the second sensor system 1068A monitors the movement or position of the stage 14A along the X, Y, and Z axes, and about the X, Y, and Z axes (six degrees of freedom). Alternatively, the actuator assembly 1016A can be designed to only move the stage 1014A along the X and Y axes, and about Z axis (planar degrees of freedom). In such embodiment, the magnetic sensor system 1066A and the second sensor system 1068A each monitor the movement of the stage 1014A along the X and Y axes, and about Z axis.

The design of the second sensor system 1068A can vary. In the embodiment illustrated in FIG. 10A, the second sensor system 1068A is an interferometer system.

The signal processor 1020A is electrically connected to the measurement system 1018A, and utilizes second sensor signals from the second sensor system 1068A and/or magnetic sensor signals from the magnetic sensor system 1066A to monitor the movement of the stage 1014A. The signal processor 1020A is also electrically connected to, directs and controls electrical current to the actuator assembly 1016A to precisely position the device 22. With information regarding the movement or position of the stage 1014A, the signal processor 1020A can direct current to the actuator assembly 1016A so that the stage 1014A follows the desired trajectory.

Figure 10B:
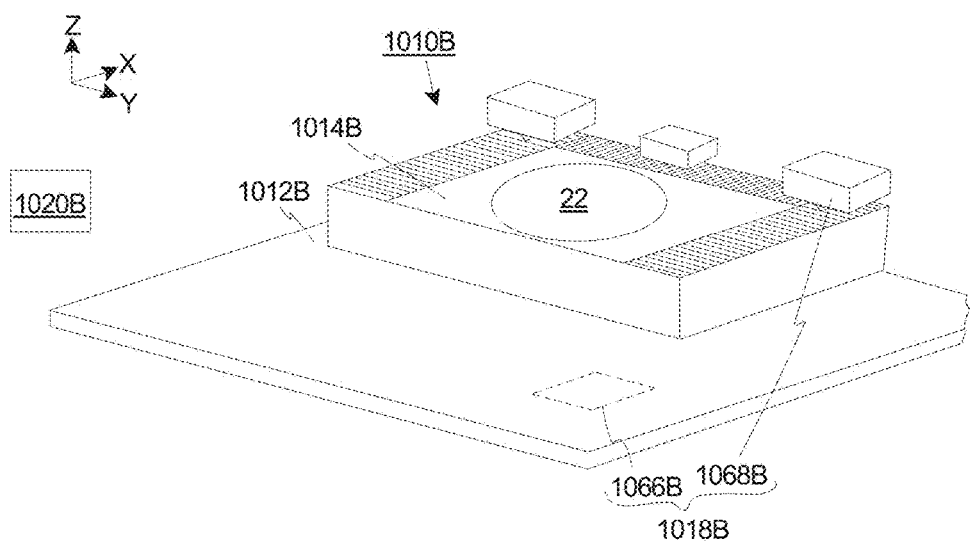
FIG. 10B is a simplified perspective view illustration of still another embodiment of a stage assembly having features of the present invention.

FIG. 10B is a simplified perspective illustration of still another embodiment of the stage assembly 1010B that includes a base 1012B, a stage 1014B, and an actuator assembly 1016B that includes a measurement system 1018B and a signal processor 1020B (illustrated as a box). The base 1012B, the stage 1014B and the signal processor 1020B are substantially similar to the previous embodiment. However, in this embodiment, the measurement system 1018B is slightly different. More specifically, in this embodiment, the measurement system 1018B again includes a magnetic sensor system 1066B (only a portion illustrated in FIG. 10B), and a second sensor system 1068B (only a portion illustrated in FIG. 10B). However, in this embodiment, the second sensor system 1068B is an encoder assembly that includes one or more encoders that monitor the movement of the stage 1014B along and about the first, second and third axes.

Figure 10C:
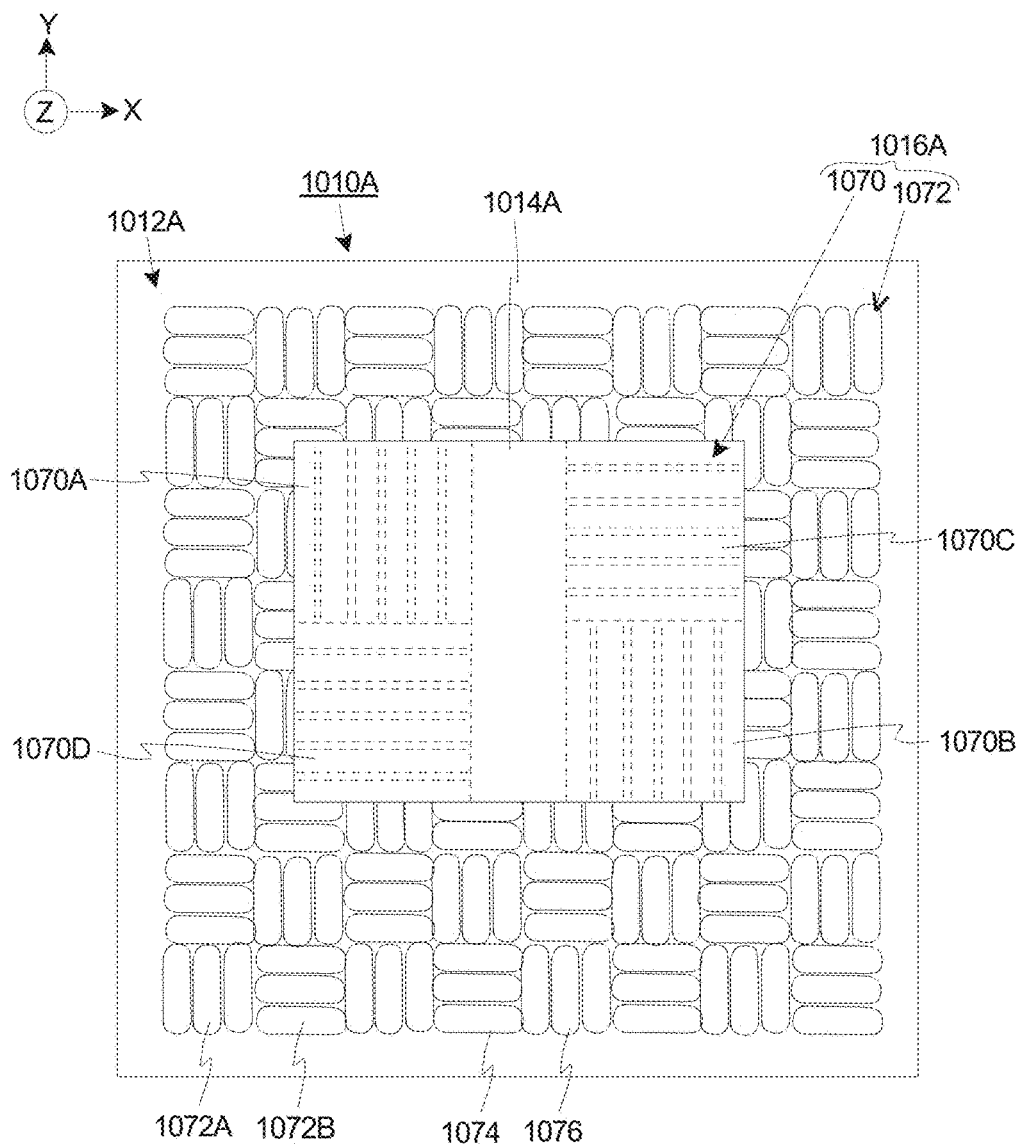
FIG. 10C is a top plan view of a portion of the stage assembly illustrated in FIG. 10A.

FIG. 10C is a top plan view of a portion of the stage assembly 1010A illustrated in FIG. 10A. In particular, FIG. 10C illustrates the base 1012A, the stage 1014A, and the actuator assembly 1016A of the stage assembly 1010A.

As shown in FIG. 10C, the actuator assembly 1016A can be a planar motor that includes a mover magnet assembly 1070 (illustrated in phantom), and a mover conductor assembly 1072. Additionally, (i) the mover conductor assembly 1072 can include a plurality of first axis conductor units 1072A (sometimes referred to as "X conductor units"), and a plurality of second axis conductor units 1072B (sometimes referred to as "Y conductor units"); and (ii) the mover magnet assembly 1070 can include a pair of spaced apart, first axis magnet arrays 1070A, 1070B (sometimes referred to as "a first X magnet array 1070A and a second X magnet array 1070B"), and a pair of spaced apart, second axis magnet arrays 1070C, 1070D (sometimes referred to as "a first Y magnet array 1070C and a second Y magnet array 1070D").

Each first axis magnet array 1070A, 1070B includes a plurality of first axis magnets (sometimes referred to as "X magnets"), and the second axis magnet array 1070C, 1070D includes a plurality of second axis magnets (sometimes referred to as "Y magnets"). Further, the number of magnets in the arrays can vary. In one embodiment, (i) each X magnet array 1070A, 1070B includes six X magnets that extend along the Y axis and that are spaced apart along the X axis; and (ii) each Y magnet array 1070C, 1070D includes six Y magnets that extend along the X axis and that are spaced apart along the Y axis.

In one embodiment, the X magnets in each X magnet array 1070A, 1070B are arranged so that X magnets alternate with the North pole and the South pole facing the conductor array as you move along the X axis. Similarly, the Y magnets in each Y magnet array 1070C, 1070D are arranged so that Y magnets alternate with the North pole and the South pole facing the conductor array as you move along the Y axis. With this design, each magnet array has a substantially sinusoidal magnetic flux. In certain embodiments, the spaces between adjacent magnets is filled with additional magnets (not shown) with a horizontal or diagonal magnetization direction to form a Halbach magnet array, as is well-known to those skilled in the art. As provided herein, each magnet array 1070A, 1070B, 1070C, 1070D has a magnetic pitch that is defined by the distance between adjacent North (or South) poles. As one non-exclusive example, each magnet can be made of a permanent magnetic material such as NdFeB.

In the non-exclusive embodiment illustrated in FIG. 10C, the mover conductor assembly 1072 is a checkerboard pattern with the X conductor units 1072A arranged in an alternating fashion with the Y conductor units 1072B along the X axis and along the Y axis. Stated in another fashion, the mover conductor assembly 1072 is organized as a grid that includes eight columns (aligned with the Y axis) of conductor units 1072A, 1072B. Further, in each column, the X conductor units 1072A are alternatively interspersed with the Y conductor units 1072B. Moreover, the conductor units 1072A, 1072A are all in the same Z plane.

Each conductor unit 1072A, 1072B includes one or more conductors. In FIG. 10C, (i) each X conductor unit 1072A includes three, adjacent, X conductors 1074 that are aligned side by side along the X axis; and (i) each Y conductor unit 1072B includes three, adjacent, Y conductors 1076 that are aligned side by side along the Y axis. With this design, a plurality of first axis conductors 1074 form a three-phase motor with the first axis magnet arrays 1070A, 1070B, and a plurality of second axis conductors 1076 form a three-phase motor with the second axis magnet arrays 1070C, 1070D.

Further, each conductor 1074, 1076 can be substantially oval-shaped, i.e. a race track type conductor. Moreover, each conductor 1074, 1076 can be made by coiling a metal wire such as copper or any substance or material responsive to electrical current and capable of creating a magnetic field such as superconductors. Other conductor shapes which are known in the use of linear and planar motors can also be used in alternative embodiments.

FIG. 11 is a simplified illustration of yet another embodiment of the stage assembly 1110, in partial cut-away. As illustrated, the stage assembly 1110 is substantially similar to the stage assembly 10 illustrated and described above in relation to FIG. 1. In particular, the stage assembly 1110 again includes a base 1112, a stage 1114 that retains the device 22, and an actuator assembly 1116 that includes a measurement system 1118 (i.e. a magnet sensor assembly) and a signal processor 1120 that are substantially similar to what was illustrated and described in relation to FIG. 1.

However, in this embodiment, the measurement system 1118 further includes a second sensor system 1168 similar to what was illustrated and described in relation to FIGS. 10A and 10B. The design of the second sensor system 1168 can vary. In the embodiment illustrated in FIG. 11, the second sensor system 1168 is an interferometer system. Alternatively, the second sensor system 1168 can be an encoder assembly that includes one or more encoders that monitor the movement of the stage 1114. With this design, for example, the second sensor system 1168 can be used to calibrate the first sensor system, and/or one of the sensor systems can be used as a primary system and the other as a backup system.

Figure 12:
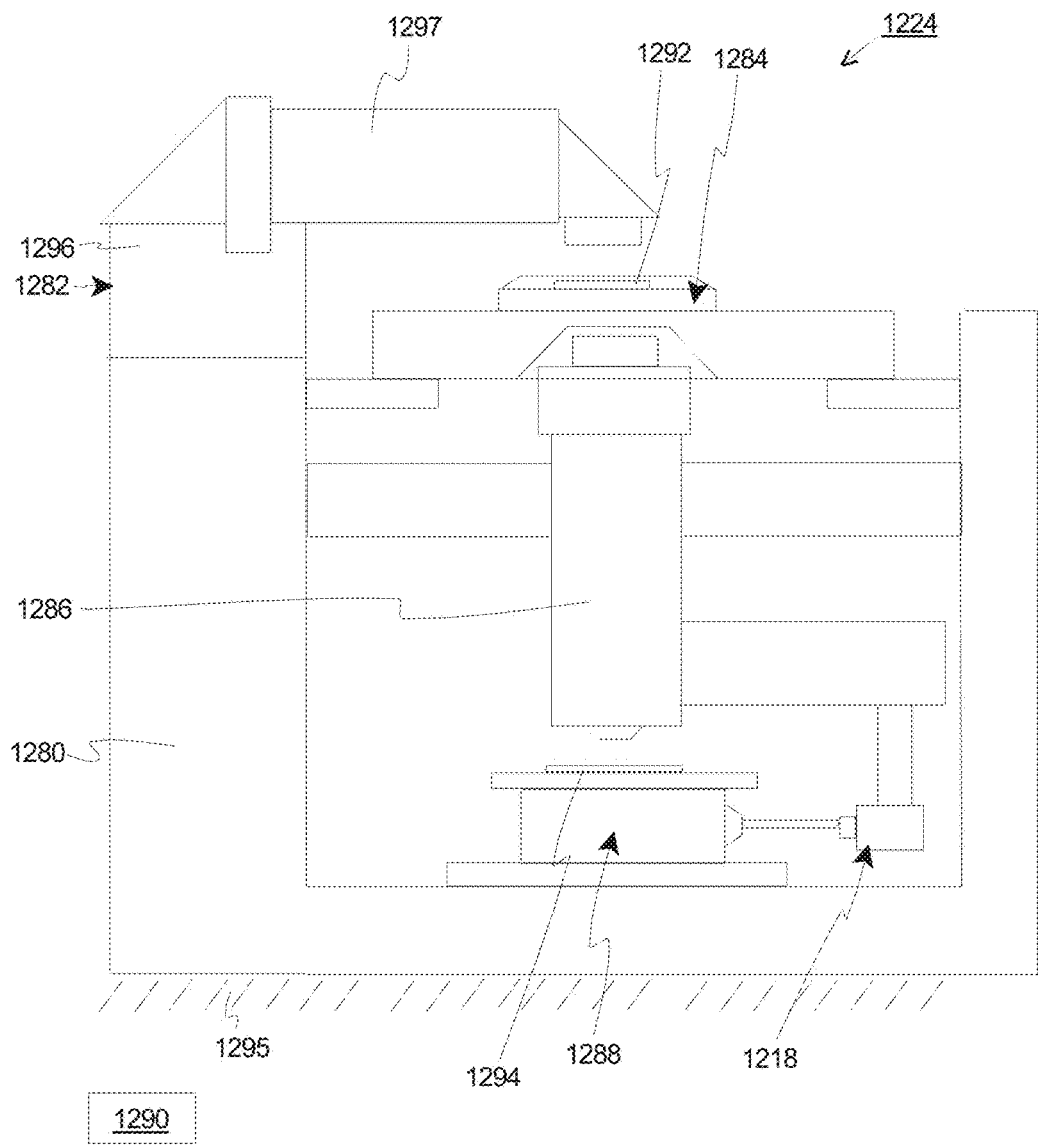
FIG. 12 is a schematic illustration of an exposure apparatus having features of the present invention.

FIG. 12 is a schematic view illustrating an exposure apparatus 1224 useful with the present invention. The exposure apparatus 1224 includes an apparatus frame 1280, a measurement system 1218 (only a portion is illustrated in FIG. 12), an illumination system 1282 (irradiation apparatus), a reticle stage assembly 1284, an optical assembly 1286 (lens assembly), a wafer stage assembly 1288, and a control system 1290 that controls the reticle stage assembly 1284 and the wafer stage assembly 1288. In certain applications, the stage assemblies described in detail herein above can be used as the wafer stage assembly 1288. Alternately, in other applications, the stage assemblies can be used as the reticle stage assembly 1284.

The exposure apparatus 1224 is particularly useful as a lithographic device that transfers a pattern (not shown) of an integrated circuit from a reticle 1292 onto a semiconductor wafer 1294. The exposure apparatus 1224 mounts to a mounting base 1295, e.g., the ground, a base, or floor or some other supporting structure.

The apparatus frame 1280 is rigid and supports the components of the exposure apparatus 1224. The design of the apparatus frame 1280 can be varied to suit the design requirements for the rest of the exposure apparatus 1224.

The illumination system 1282 includes an illumination source 1296 and an illumination optical assembly 1297. The illumination source 1296 emits a beam (irradiation) of light energy. The illumination optical assembly 1297 guides the beam of light energy from the illumination source 1296 to the reticle 1292. The beam illuminates selectively different portions of the reticle 1292 and exposes the semiconductor wafer 1294.

The optical assembly 1286 projects and/or focuses the light passing through the reticle 1292 to the wafer 1294. Depending upon the design of the exposure apparatus 1224, the optical assembly 1286 can magnify or reduce the image illuminated on the reticle 1292.

The reticle stage assembly 1284 holds and positions the reticle 1292 relative to the optical assembly 1286 and the wafer 1294. Similarly, the wafer stage assembly 1288 holds and positions the wafer 1294 with respect to the projected image of the illuminated portions of the reticle 1292.

There are a number of different types of lithographic devices. For example, the exposure apparatus 1224 can be used as scanning type photolithography system that exposes the pattern from the reticle 1292 onto the wafer 1294 with the reticle 1292 and the wafer 1294 moving synchronously. Alternatively, the exposure apparatus 1224 can be a step-and-repeat type photolithography system that exposes the reticle 1292 while the reticle 1292 and the wafer 1294 are stationary.

However, the use of the exposure apparatus 1224 and the stage assemblies provided herein are not limited to a photolithography system for semiconductor manufacturing. The exposure apparatus 1224, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

A photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 13A:
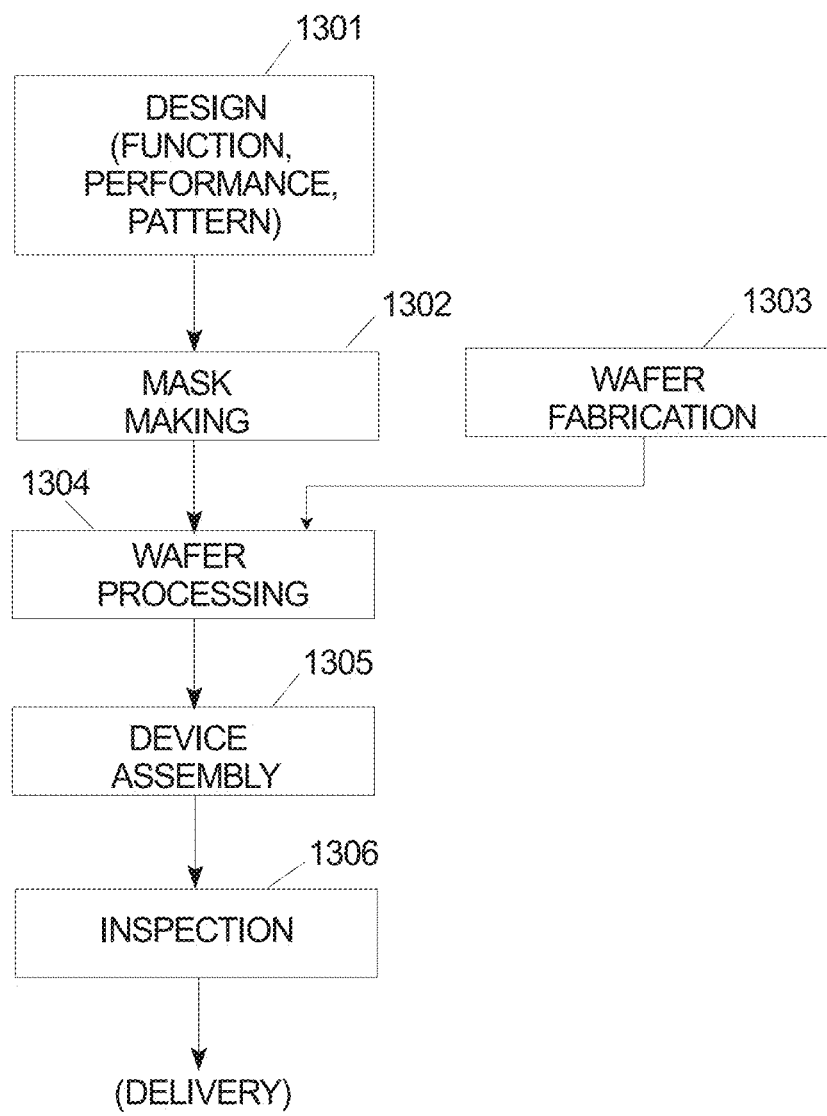
FIG. 13A is a flow chart that outlines a process for manufacturing a device in accordance with the present invention.

Further, semiconductor devices can be fabricated using the above described systems, by the process shown generally in FIG. 13A. In step 1301 the device's function and performance characteristics are designed. Next, in step 1302, a mask (reticle) having a pattern is designed according to the previous designing step, and in a parallel step 1303 a wafer is made from a silicon material. The mask pattern designed in step 1302 is exposed onto the wafer from step 1303 in step 1304 by a photolithography system described hereinabove in accordance with the present invention. In step 1305 the semiconductor device is assembled (including the dicing process, bonding process and packaging process), finally, the device is then inspected in step 1306.

Figure 13B:
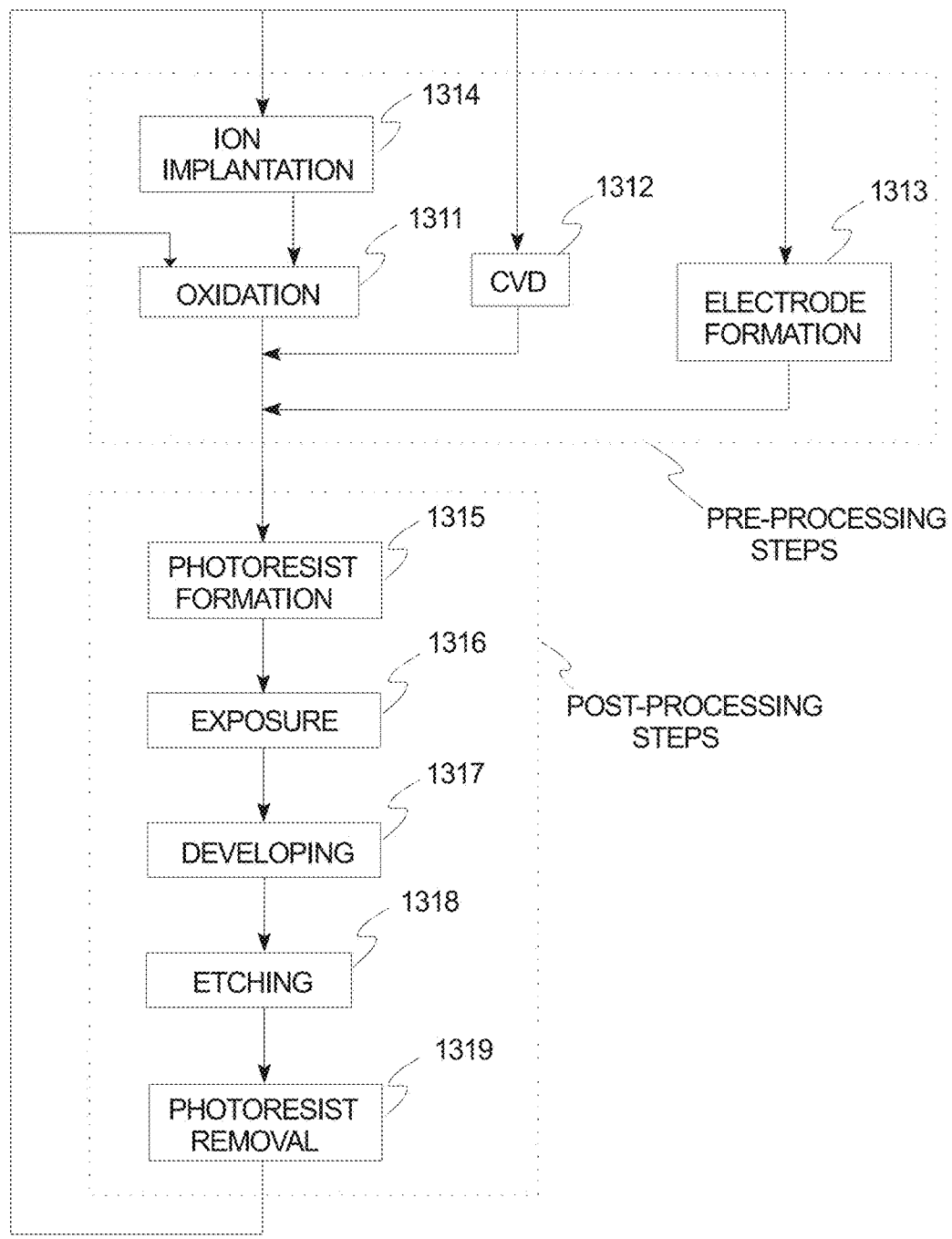
FIG. 13B is a flow chart that outlines device processing in more detail.

FIG. 13B illustrates a detailed flowchart example of the above-mentioned step 1304 in the case of fabricating semiconductor devices. In FIG. 13B, in step 1311 (oxidation step), the wafer surface is oxidized. In step 1312 (CVD step), an insulation film is formed on the wafer surface. In step 1313 (electrode formation step), electrodes are formed on the wafer by vapor deposition. In step 1314 (ion implantation step), ions are implanted in the wafer. The above-mentioned steps 1311-1314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1315 (photoresist formation step), photoresist is applied to a wafer. Next, in step 1316 (exposure step), the above-mentioned exposure device is used to transfer the circuit pattern of a mask (reticle) to a wafer. Then in step 1317 (developing step), the exposed wafer is developed, and in step 1318 (etching step), parts other than residual photoresist (exposed material surface) are removed by etching. In step 1319 (photoresist removal step), unnecessary photoresist remaining after etching is removed.

Multiple circuit patterns are formed by repetition of these preprocessing and post-processing steps.

It is understood that although a number of different embodiments of the stage assembly 10 and/or the actuator assembly 16 have been illustrated and described herein, one or more features of any one embodiment can be combined with one or more features of one or more of the other embodiments, provided that such combination satisfies the intent of the present invention.

While a number of exemplary aspects and embodiments of a stage assembly 10 and/or an actuator assembly 16 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An actuator assembly for moving a device, the actuator assembly comprising:
   a stator component;
   a mover component that moves relative to the stator component along a mover axis, the mover component being coupled to the device so that the device moves relative to the stator component as the mover component is moved relative to the stator component along the mover axis;

a measurement system that monitors movement of the mover component relative to the stator component, the measurement system including (i) a magnet assembly that is coupled to and moves with the mover component, the magnet assembly producing a consistent magnetic field that moves relative to the stator component as the mover component moves relative to the stator component; and (ii) a plurality of spaced apart sensors that are fixed in position relative to the stator component, the sensors being positioned along a path of the mover component such that at least two of the sensors are positioned within an active region of the magnetic field at all times as the mover component moves relative to the stator component along the mover axis, the sensors being configured to sense changes in the magnetic field produced by the magnet assembly as the mover component moves along the mover axis; and wherein each sensor is a transducer that generates a sensor signal that varies its output voltage in response to the changing magnetic field from the magnet assembly as the mover component is moved relative to the sensors;

an actuator that moves the mover component and the magnet assembly relative to the stator component while the magnet assembly is being used for monitoring movement of the mover component relative to the stator component; and a signal processor that receives the sensor signals and estimates a position of the mover component along the mover axis at a given point in time based at least in part on the sensor signals from the at least two of the sensors that are positioned within the active region of the magnetic field at the given point in time.

2. The actuator assembly of claim 1 wherein the plurality of sensors are aligned and spaced apart along a sensor axis that is substantially parallel to the mover axis.

3. The actuator assembly of claim 1 wherein the mover component only moves along the mover axis relative to the stator component.

4. The actuator assembly of claim 3 wherein the stator component includes a tubular-shaped stator body, and the mover component includes a piston disc that is positioned within the stator body and is configured to move along the mover axis relative to the stator body.

5. The actuator assembly of claim 4 wherein the mover component and the stator component cooperate to form a first chamber within the stator body on one side of the piston disc, and a second chamber within the stator body on the opposite side of the piston disc; wherein the actuator includes a fluid source that is in fluid communication with the first chamber via a first transfer port and that is in fluid communication with the second chamber via a second transfer port; and wherein the actuator selectively directs fluid from the fluid source into and out of the first chamber and the second chamber via the first transfer port and the second transfer port, respectively, to selectively control a pressure in each of the first chamber and the second chamber.

6. The actuator assembly of claim 1 wherein the actuator moves the mover component relative to the stator component along the mover axis; and wherein the signal processor is electrically connected to the actuator to position the mover component and the device relative to the stator component based at least in part on the sensor signals.

7. The actuator assembly of claim 1 further comprising a calibration measurement system that generates a mapping signal as the mover component is moved along the mover axis; and wherein the signal processor is configured to map a position of each of the plurality of sensors based at least in part on the sensor signals and the mapping signal.

8. The actuator assembly of claim 1 wherein the signal processor uses a look-up table and the sensor signals to estimate the position of the mover component.

9. The actuator assembly of claim 1 wherein the signal processor uses a curve-fitting method to estimate the position of the mover component from the sensor signals.

10. The actuator assembly of claim 1 wherein the signal processor uses a triangle curve-fitting method to estimate the position of the mover component from the sensor signals.

11. The actuator assembly of claim 1 wherein the magnet assembly includes a permanent magnet that is surrounded by the magnetic field; wherein the magnet assembly has a magnet axis that is substantially parallel to the mover axis; and wherein the permanent magnet has a perpendicular orientation relative to the magnet axis.

12. The actuator assembly of claim 1 wherein the magnet assembly includes a permanent magnet that is surrounded by the magnetic field; wherein the magnet assembly has a magnet axis that is substantially parallel to the mover axis; and wherein the permanent magnet has an axial orientation relative to the magnet axis.

13. The actuator assembly of claim 1 wherein the signal processor estimates the position of the mover component along the mover axis at the given point in time based only on the sensor signals from the at least two of the sensors that are positioned within the active region of the magnetic field at the given point in time.

14. A method for moving a device, the method comprising the steps of:

providing a stator component;

coupling a mover component to the device;

moving the mover component relative to the stator component along a mover axis with an actuator so that the device moves relative to the stator component as the mover component is moved relative to the stator component along the mover axis;

coupling a magnet assembly to the mover component, the magnet assembly producing a consistent magnetic field that moves relative to the stator component as the mover component moves relative to the stator component;

positioning a plurality of spaced apart sensors in a fixed position relative to the stator component, the sensors being positioned along a path of the mover component such that at least two of the sensors are positioned within an active region of the magnetic field at all times as the mover component moves relative to the stator component along the mover axis, the sensors being configured to sense changes in the magnetic field produced by the magnet assembly as the mover component moves along the mover axis, each sensor being a transducer that generates a sensor signal that varies its output voltage in response to the changing magnetic field from the magnet assembly as the mover component is moved relative to the sensors;

receiving the sensor signals with a signal processor; and estimating a position of the mover component along the mover axis at a given point in time with the signal processor based at least in part on the sensor signals from the at least two of the sensors that are positioned within the active region of the magnetic field at the given point in time; and wherein the actuator moves the mover component and the magnet assembly relative to the stator component while the magnet assembly is being used for monitoring movement of the mover component relative to the stator component.

15. The method of claim 14 wherein the step of positioning includes the plurality of sensors being aligned and spaced apart along a sensor axis that is substantially parallel to the mover axis.

16. The method of claim 14 further comprising the steps of electrically connecting the signal processor to the actuator, and positioning the mover component and the device relative to the stator component with the signal processor based at least in part on the sensor signals.

17. The method of claim 14 wherein the step of estimating includes estimating a position of the mover component along the mover axis with the signal processor using a look-up table and the sensor signals.

18. The method of claim 14 wherein the step of estimating includes estimating a position of the mover component along the mover axis with the signal processor based on the sensor signals using a curve-fitting method.

19. The method of claim 14 wherein the step of coupling a magnet assembly includes the magnet assembly including a permanent magnet that is surrounded by the magnetic field; the magnet assembly having a magnet axis that is substantially parallel to the mover axis; and the permanent magnet having a perpendicular orientation relative to the magnet axis.

20. The method of claim 14 wherein the step of coupling a magnet assembly includes the magnet assembly including a permanent magnet that is surrounded by the magnetic field; the magnet assembly having a magnet axis that is substantially parallel to the mover axis; and the permanent magnet having an axial orientation relative to the magnet axis.

* * * * *